(12) United States Patent
Shimizu et al.

(10) Patent No.: US 8,674,411 B2
(45) Date of Patent: Mar. 18, 2014

(54) SEMICONDUCTOR DEVICE EMPLOYING CIRCUIT BLOCKS HAVING THE SAME CHARACTERISTICS

(75) Inventors: Hiroshi Shimizu, Tokyo (JP); Takamitsu Onda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 36 days.

(21) Appl. No.: 13/517,690

(22) Filed: Jun. 14, 2012

(65) Prior Publication Data

US 2013/0001649 A1    Jan. 3, 2013

(30) Foreign Application Priority Data

Jun. 28, 2011   (JP) ................................. 2011-142716

(51) Int. Cl.
*H01L 23/52*   (2006.01)
(52) U.S. Cl.
USPC ................... 257/208; 257/401; 257/E27.011; 257/E27.014
(58) Field of Classification Search
USPC ................... 257/208, 401, E27.011, E27.014
See application file for complete search history.

(56) References Cited

U.S. PATENT DOCUMENTS 7,324,097 B2 *   1/2008   Koyama et al. ............... 345/204

FOREIGN PATENT DOCUMENTS

JP         2009-086880 A       4/2009

* cited by examiner

*Primary Examiner* — Tu-Tu Ho
(74) *Attorney, Agent, or Firm* — McGinn IP Law Group, PLLC

(57) ABSTRACT

A semiconductor device is disclosed, which comprises first and second input ports, first and second output nodes, and first and second transistors. The first transistor includes first and second diffusion regions defining a first channel region and a first gate electrode and connected to the first input port, the first diffusion region being connected to the first output node, the second diffusion region being disposed between the first diffusion region and the first input port and supplied with a first operating potential. The second transistor includes third and fourth diffusion regions defining a second channel region and a second gate electrode and connected to the second input port, the third diffusion region being supplied with the first operating potential, the fourth diffusion region being disposed between the third diffusion region and the second input port and connected to the second output node.

14 Claims, 31 Drawing Sheets

SEMICONDUCTOR DEVICE EMPLOYING CIRCUIT BLOCKS HAVING THE SAME CHARACTERISTICS

BACKGROUND OF THE INVENTION

1. Field of the Invention

The present invention relates to a semiconductor device, and more particularly to a semiconductor device including a plurality of circuit blocks or cells that need to have exactly the same characteristics.

2. Description of Related Art

Some semiconductor devices include a plurality of circuit blocks that need to have exactly the same characteristics. An example of such circuit blocks is an input first-stage circuit. Input first-stage circuits are connected to data pads to which external data is supplied. The timing of change of internal data generated by input first-stage circuits depends on the characteristics of the input first-stage circuits. To exactly match the timing of change of a plurality of internal data, a plurality of input first-stage circuits need to have exactly the same characteristics.

The characteristics of the circuit blocks can be made the same by arranging the circuit blocks in the same layout. Specifically, the circuit blocks may be configured so that a plurality of transistors constituting the circuit blocks have the same shapes and sizes. If such circuit blocks are input first-stage circuits, a plurality of data pads related to the plurality of input first-stage circuits may be arranged in a row so that the input first-stage circuits having the same layout are arranged along the data pads. This makes the characteristics of the input first-stage circuits almost the same. If data pads are too many to arrange in a row, the data pads may be arranged in two rows and input first-stage circuits having the same layout may be arranged along the respective corresponding data pads. Here, the input first-stage circuits assigned to one of the rows of data pads and the input first-stage circuits assigned to the other row of data pads can be symmetrically arranged to make the wiring loads in the respective input first-stage circuits the same.

When a plurality of input first-stage circuits are symmetrically arranged, the input first-stage circuits arranged in one row and the input first-stage circuits arranged in the other row are oriented in 180° different directions. In other words, a plurality of transistors included in the input first-stage circuits arranged in one row and a plurality of transistors included in the input first-stage circuits arranged in the other row have the same shapes and sizes but are laid out in 180° different directions. Consequently, currents flowing in the input first-stage circuits are in 180° different directions. If source-side resistances and drain-side resistances are different due to process conditions, then such input first-stage circuits produce a slight difference in characteristic.

FIG. 16 of Japanese Patent Application Laid-Open No. 2009-86880 discloses matching the directions of currents in circuit blocks. In this case, however, the circuit blocks have different wiring loads. Such a difference is not limited no input first-stage circuits but is common to a plurality of circuit blocks that need to have exactly the same characteristics.

SUMMARY

In one embodiment, there is provided a semiconductor device that includes: first and second ports arranged on a first axis and arranged symmetrically to each other with respect to a second axis; first and second circuits coupled to the first and second ports, respectively, and arranged symmetrically to each other with respect to the second axis; and first and second nodes to which output signals from the first and second circuits are supplied, respectively, and arranged symmetrically to each other with respect to the second axis. The first circuit includes first and second transistors that generate first and second signals, respectively, the second circuit includes third and fourth transistors that generate third and fourth signals, respectively, directions of flow of the first and second signals and directions of flow of the third and fourth signals are different from each other along the first axis, directions of currents flowing through the first and third transistors are different from each other along the first axis, and directions of currents flowing through the second and fourth transistors are the same as each other along the first axis.

In another embodiment, such a semiconductor device is provided that comprises first and second input ports; first and second output nodes; a first transistor including first and second diffusion regions defining a first channel region therebetween and a first gate electrode formed over the first channel region, the first diffusion region being electrically connected to the first output node, the second diffusion region being disposed between the first diffusion region and the first input port and supplied with a first operating potential, and the first gate electrode being electrically connected to the first input port; and a second transistor including third and fourth diffusion regions defining a second channel region therebetween and a second gate electrode formed over the second channel region, the third diffusion region being supplied with the first operating potential, the fourth diffusion region being disposed between the third diffusion region and the second input port and electrically connected to the second output node, and the second gate electrode being electrically connected to the second input port.

Still another embodiment provides a semiconductor device that comprises first and second input ports; first and second output nodes; a first transistor including first and second diffusion regions defining a first channel region therebetween and a first gate electrode formed over the first channel region, the first diffusion region being electrically connected to the first output node, the second diffusion region being disposed between the first diffusion region and the first input port and supplied with a first operating potential, and the first gate electrode being supplied with a first reference potential; a second transistor including third and fourth diffusion regions defining a second channel region therebetween and a second gate electrode formed over the second channel region, the third diffusion region being electrically connected to the first output node, the fourth diffusion region being disposed between the first and third diffusion regions and supplied with the first operating potential, and the first gate electrode being electrically connected to the first input port; a third transistor including fifth and sixth diffusion regions defining a third channel region therebetween and a third gate electrode formed over the third channel region, the fifth diffusion region being supplied with the first operating potential, the sixth diffusion region being disposed between the second input port and the fifth diffusion region and electrically connected to the second output node, and the third gate electrode being electrically connected to the second input port; and a fourth transistor including seventh and eighth diffusion regions defining a fourth channel region therebetween and a fourth gate electrode formed over the fourth channel region, the seventh diffusion region being supplied with the first operating potential, the eighth diffusion region being disposed between the fifth and seventh diffusion regions and electrically connected to the second output node, and the fourth gate electrode being supplied with the first reference potential.

DETAILED DESCRIPTION OF THE EMBODIMENTS

A representative example of the technical concept of an embodiment of the present invention will be described below. It will be understood that what the present invention claims are not limited to such a technical concept but set forth in the claims of the present invention. Specifically, the technical concept of the embodiment of the present invention is to provide a configuration such that: a plurality of transistors, included in two circuit blocks or cells that need to have exactly the same characteristics, have the same shapes and sizes and being arranged in the same directions; input lines for supplying input signals to the cells have the same wiring loads; and output lines for outputting output signals from the cells have the same wiring loads. Since the plurality of transistors constituting the cells have the same shapes and sizes and are arranged in the same directions, the circuit characteristics of the cells themselves become exactly the same even if source-side resistances and drain-side resistances are different. Since the input lines have the same wiring loads and the output lines have the same wiring loads, the characteristics of the cells including the signal lines also become the same. Consequently, the cells can be interchanged in position without a change in characteristic.

Figure 1:
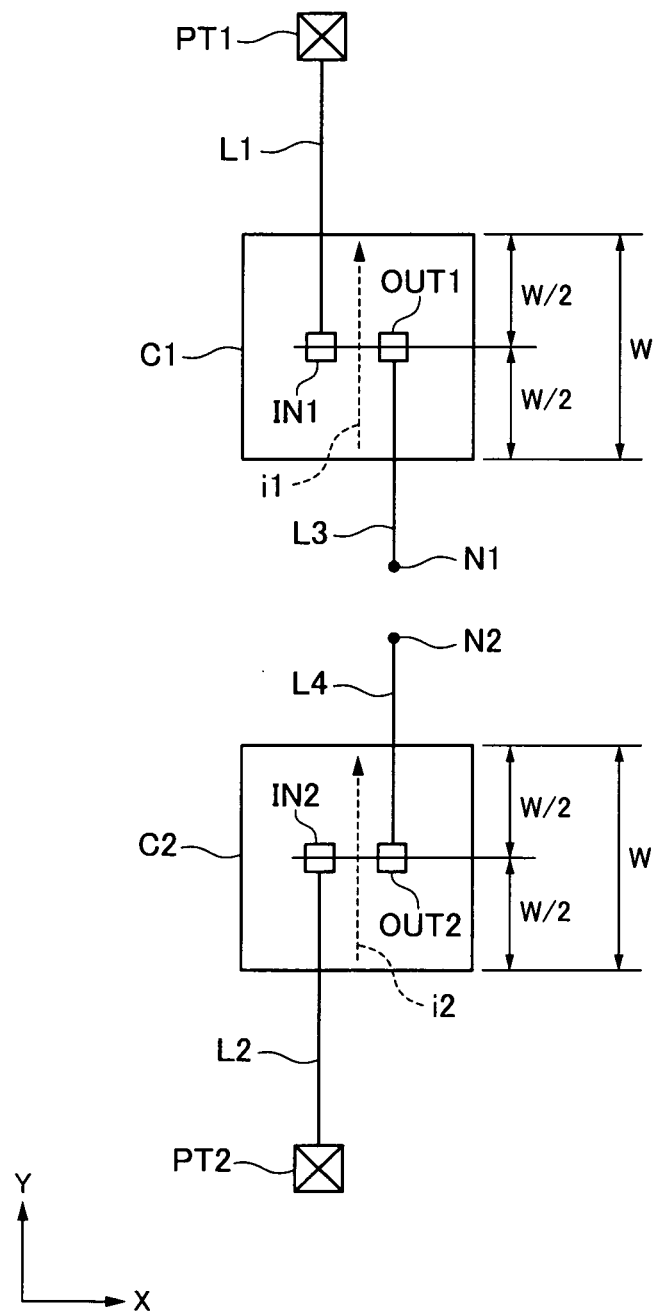
FIG. 1 is a schematic diagram for explaining an embodiment of the present invention.

Referring now to FIG. 1, a first input port PT1 (first port), a first cell C1, a first output node N1 (first node), a second output node N2 (second node), a second cell C2, and a second input port PT2 (second port) are arranged in such an order in a Y direction (first axis). Each of the first cell C1 and the second cell C2 is a circuit block (first and second circuits) including a plurality of transistors. The plurality of transistors included in the first cell C1 and the plurality of transistors included in the second cell C2 are laid out with the same shapes and sizes and in the same directions.

The first cell C1 has a length W in the Y direction. An input terminal IN1 and an output terminal OUT1 are arranged in the center in the Y direction, i.e., at the position of W/2 from both ends in the Y direction. The same holds for the second cell C2. Therefore, an input terminal IN2 and an output terminal OUT2 are arranged in the center in the Y direction.

The distance between the first cell C1 and the first input port PT1 in the Y direction is the same as that between the second cell C2 and the second input port PT2 in the Y direction. Input lines L1 and L2 thus have the same wiring loads. Similarly, the distance between the first cell C1 and the first output node N1 in the Y direction is the same as that between the second cell C2 and the second output node N2 in the Y direction. Output lines L3 and L4 thus have the same wiring loads.

Consequently, the first cell C1 and the second cell C2 have exactly the same characteristics. Since the first and second cells C1 and C2 are identical not only in shape and size but in direction as well, the direction i1 of a current flowing in the first cell C1 is the same as the direction i2 of a current flowing in the second cell C2. Consequently, even if source-side resistances and drain-side resistances are different due to process conditions, there is no difference in characteristic between the first cell C1 and the second cell C2.

In the embodiment shown in FIG. 1, the input terminals IN1 and IN2 and the output terminals OUT1 and OUT2 are arranged in the centers in the Y direction, whereby the wiring loads are made the same. As will be described in detail in the following preferred embodiments, such terminals need not necessarily be arranged in the centers in the Y direction and may be arranged with offsets. In such a case, dummy wiring may be formed to match the wiring loads.

More detailed embodiments of the present invention will be explained below with reference to the accompanying drawings.

Figure 2:
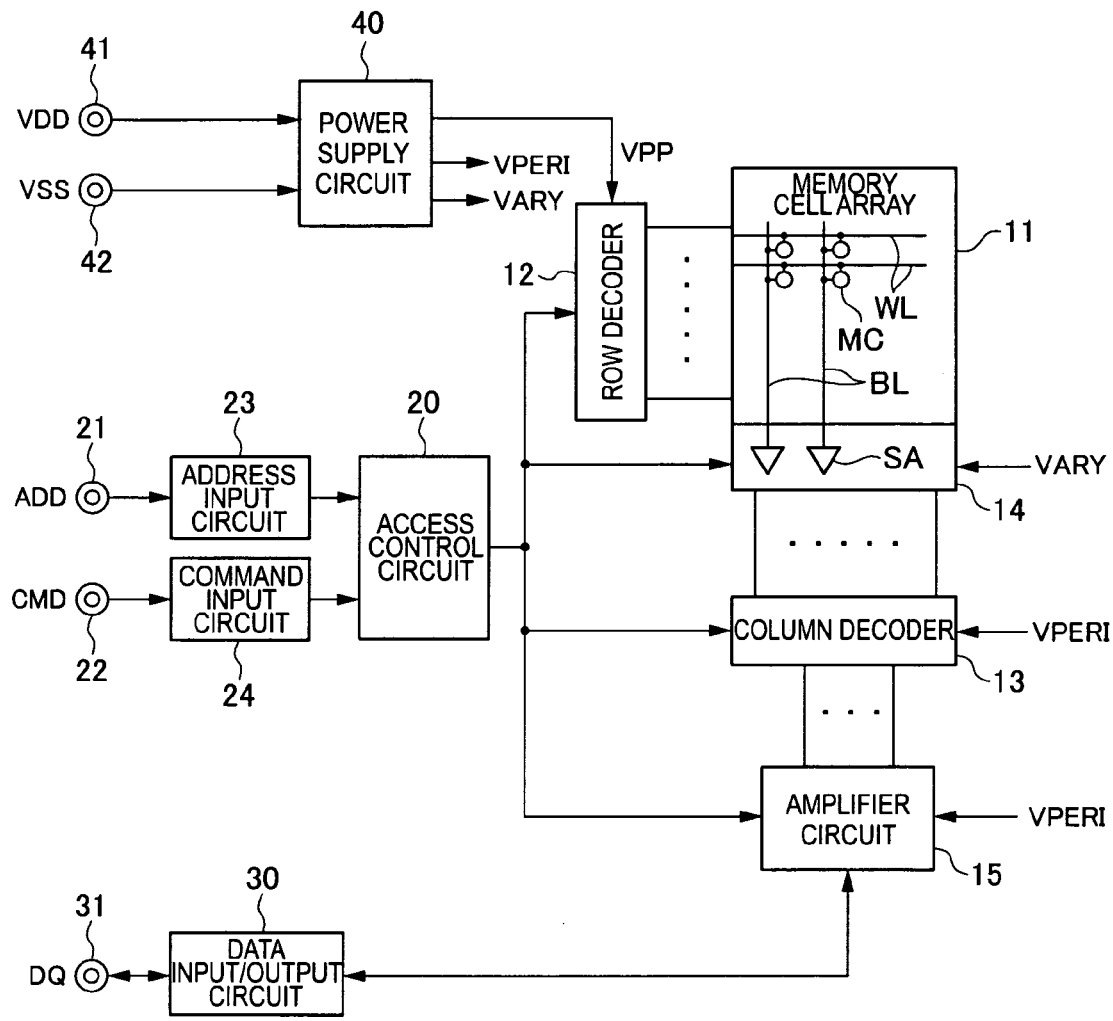
FIG. 2 is a block diagram showing the overall configuration of a semiconductor device 10 according to an embodiment of the present invention.

Turning to FIG. 2, the semiconductor device 10 according to the embodiment of the present invention is a DRAM (Dynamic Random Access Memory). As shown in FIG. 2, the semiconductor device 10 includes a memory cell array 11. The memory cell array 11 includes a plurality of word lines WL and a plurality of bit lines BL which intersect each other. Memory cells MC are arranged at the intersections of the word lines WL and bit lines BL. The word lines WL are selected by a row decoder 12. The bit lines BL are selected by a column decoder 13. The bit lines BL are connected to respective corresponding sense amplifiers SA in a sense circuit 14. Bit lines BL selected by the column decoder 13 are connected to an amplifier circuit 15 through sense amplifiers SA.

The operation of the row decoder 12, the column decoder 13, the sense circuit 14, and the amplifier circuit 15 is controlled by an access control circuit 20. An address signal ADD is supplied to the access control circuit 20 from outside through an address terminal 21 and an address input circuit 23. A command signal CMD is supplied to the access control circuit 20 from outside through a command terminal 22 and a command input circuit 24. The address input circuit 23 functions to receive and amplify the address signal ADD supplied to the address terminal 21. Similarly, the command input circuit 24 functions to receive and amplify the command signal CMD supplied to the command terminal 22. The access control circuit 20 receives the address signal ADD and the command signal CMD, and controls the row decoder 12, the column decoder 13, the sense circuit 14, and the amplifier circuit 15 based on the address signal ADD and the command signal CMD.

Specifically, when the command signal CMD indicates an active operation of the semiconductor device 10, the address signal ADD is supplied to the row decoder 12. The row decoder 12 selects a word line WL that is designated by the address signal ADD, whereby corresponding memory cells MC are connected to respective bit lines BL. The access control circuit 20 then activates the sense circuit 14 at predetermined timing.

Now, when the command signal CMD indicates a read operation or write operation of the semiconductor device 10, the address signal ADD is supplied to the column decoder 13. The column decoder 13 connects bit lines BL designated by the address signal ADD to the amplifier circuit 15. Consequently, in a read operation, read data DQ read from the memory cell array 11 through sense amplifiers SA is output from a data terminal 31 to outside through the amplifier circuit 15 and a data input/output circuit 30. In a write operation, write data DQ supplied from outside through the data terminal 31 and the data input/output circuit 30 is written to memory cells MC through the amplifier circuit 15 and sense amplifiers SA.

The foregoing circuit blocks each operate with a predetermined internal voltage as a power supply. Such internal power supplies are generated by a power supply circuit 40 shown in FIG. 2. The power supply circuit 40 receives an external potential VDD and a ground potential VSS supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is a voltage that is mainly used in the row decoder 12. The row decoder 12 drives a word line WL that is selected based on the address signal ADD to the VPP level, thereby making cell transistors included in the memory cells MC conducting. The internal voltage VARY is a voltage that is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. The use of the internal voltage VPERI lower than the external voltage VDD as the operating voltage of the peripheral circuits reduces the power consumption of the semiconductor device 10.

Figure 3:
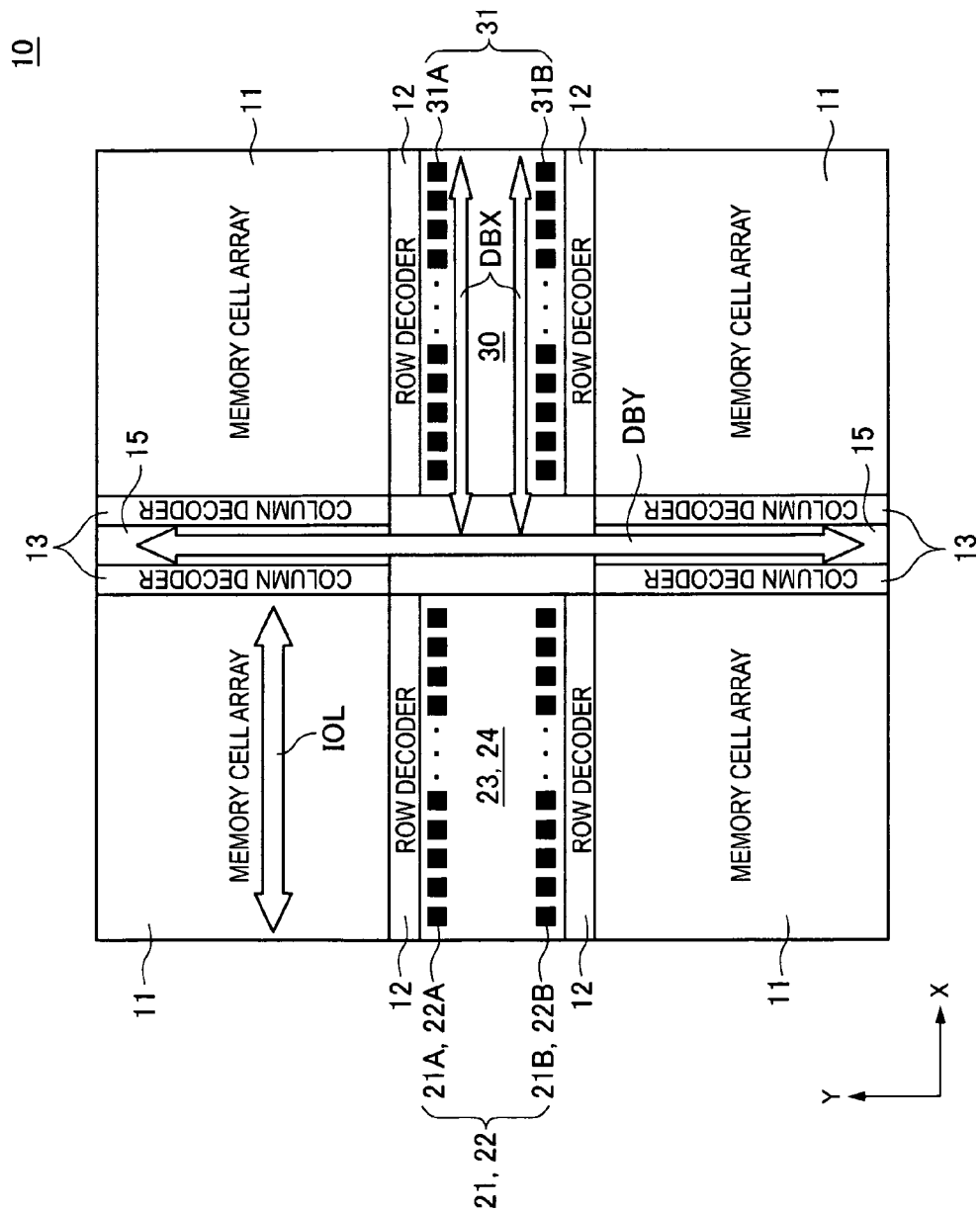
FIG. 3 is a schematic plan view showing the layout of the semiconductor device 10 shown in FIG. 2.

Turning to FIG. 3, the memory cell array 11 is divided into four and arranged in a matrix. A row decoder 12 is arranged on a Y-direct ion side of each of the divided memory cell arrays 11. A column decoder 13 is arranged on an X-direction side of each divided memory cell array 11. An amplifier circuit 15 is arranged between adjoining column decoders 13. External terminals are arranged in two rows in the X direction between adjoining row decoders 12. As shown in FIG. 3, the right area of the diagram is where a plurality of data terminals 31 are arranged in two rows. The left area of the diagram is where a plurality of address terminals 21 and a plurality of command terminals 22 are arranged in two rows.

Data input/output circuits 30 are arranged between data terminals 31A belonging to one row and data terminals 31B belonging to the other row. The data input/output circuits 30 will be described in detail later. Address input circuits 23 and command input circuits 24 are arranged between address terminals 21A and command terminals 22A belonging to one row and address terminals 21B and command terminals 22B belonging to the other row.

With such a layout, read data DQ read from the memory cell arrays 11 is supplied to the data input/output circuits 30 through I/O lines IOL which extend in the X direction, a data bus DBY which extends in the Y diction, and data buses DBX which extend in the X direction. The read data DQ is then output to the data terminals 31. Write data DQ input to the data terminals 31 is supplied to the data input/output circuits 30 and written to the memory cell arrays 11 through the data buses DBX, the data bus DBY, and the I/O fines IOL.

As shown in FIG. 3, the two-row layout of the data terminals 31 is suitable when the data terminals 31 are large in number. The number of data terminals 31 corresponds to the number of bits of read data or write data DQ to be simultaneously input/output. In multi-bit products such as 16-bit and 32-bit products, data terminals 31 may be difficult to arrange in a single row. In such cases, data terminals 31 are arranged in two rows.

Figure 4:
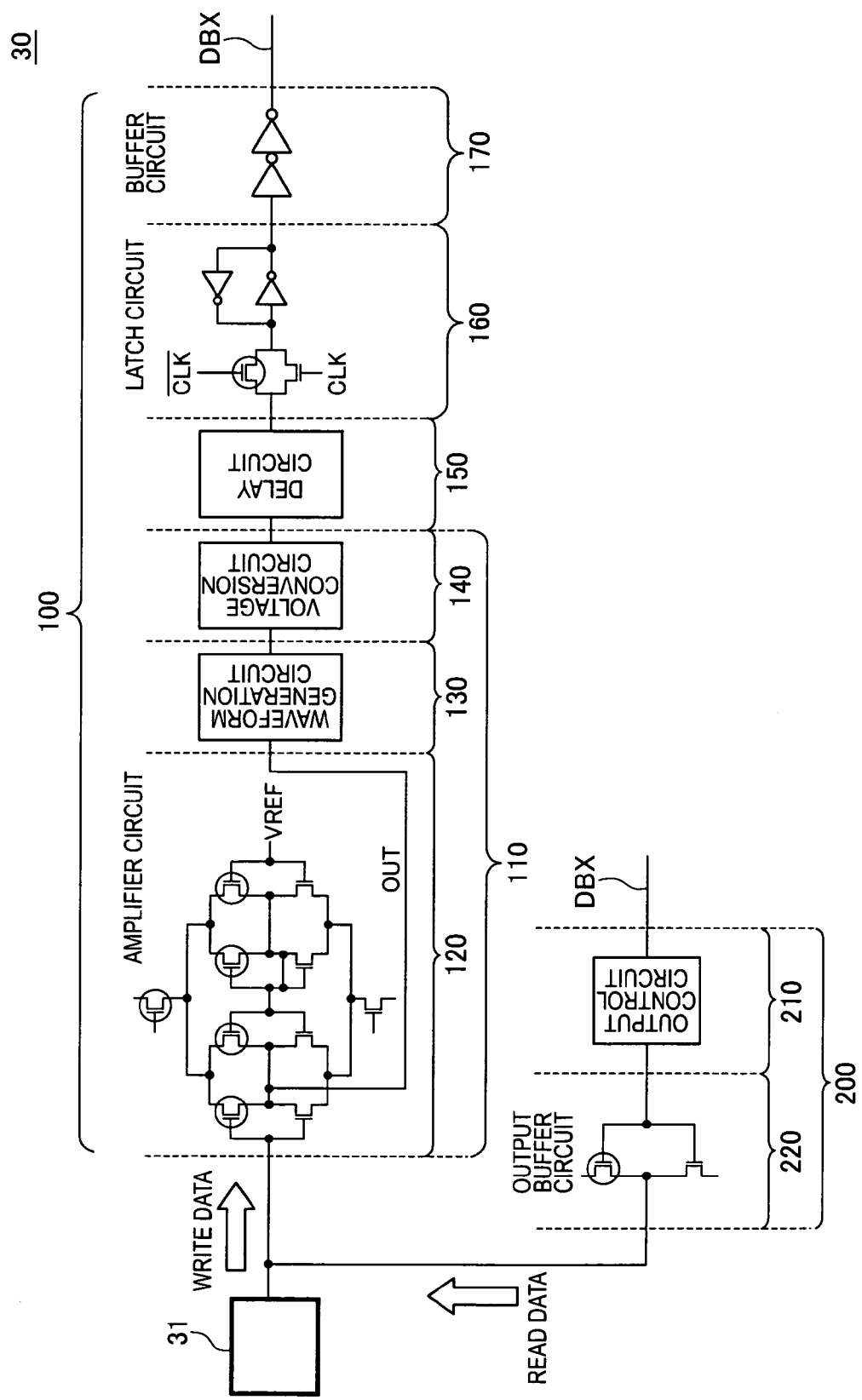
FIG. 4 is a circuit diagram of a data input/output circuit 30 shown in FIG. 2.

Turning to FIG. 4, the data input/output circuit 30 includes a data input circuit 100 and a data output circuit 200 which are connected to a corresponding data terminal 31. The data input circuit 100 includes an input first-stage circuit 110, and a delay circuit 150, a latch circuit 160, and a buffer circuit 170 which are connected subsequent to the input first-stage circuit 110. With such a configuration, write data DQ input to the data terminal 31 is supplied to the data bus DBX through the data input circuit 100. Meanwhile, the data output circuit 200 includes an output control circuit 210 and an output buffer circuit 220. With such a configuration, read data DQ on the data bus DBX is output from the data terminal 31 through the data output circuit 200.

The input first-stage circuit 110 includes an amplifier circuit 120, a waveform generation circuit 130, and a voltage conversion circuit 140. The amplifier circuit 120 is a circuit that compares the potential of write data DQ with a reference potential VREF and generates an output signal OUT based on the comparison result. The waveform generation circuit 130 is a circuit that shapes the waveform of the output signal OUT output from the amplifier circuit 120. The voltage conversion circuit 140 is a circuit that increases the amplitude of the signal output from the waveform generation circuit 130 to an internal voltage level. The waveform generation circuit 130 and the voltage conversion circuit 140 constitute a sub circuit to which the output signal of the amplifier circuit 120 is supplied.

The delay circuit 150 is a circuit for adjusting the timing of the write data DQ. The latch circuit 160 is a circuit that latches the write data DQ output from the delay circuit 150 in synchronization with clock signals CLK and/CLK. The write data DQ latched in the latch circuit 160 is supplied to the data bus DBX through the buffer circuit 170.

Figure 5:
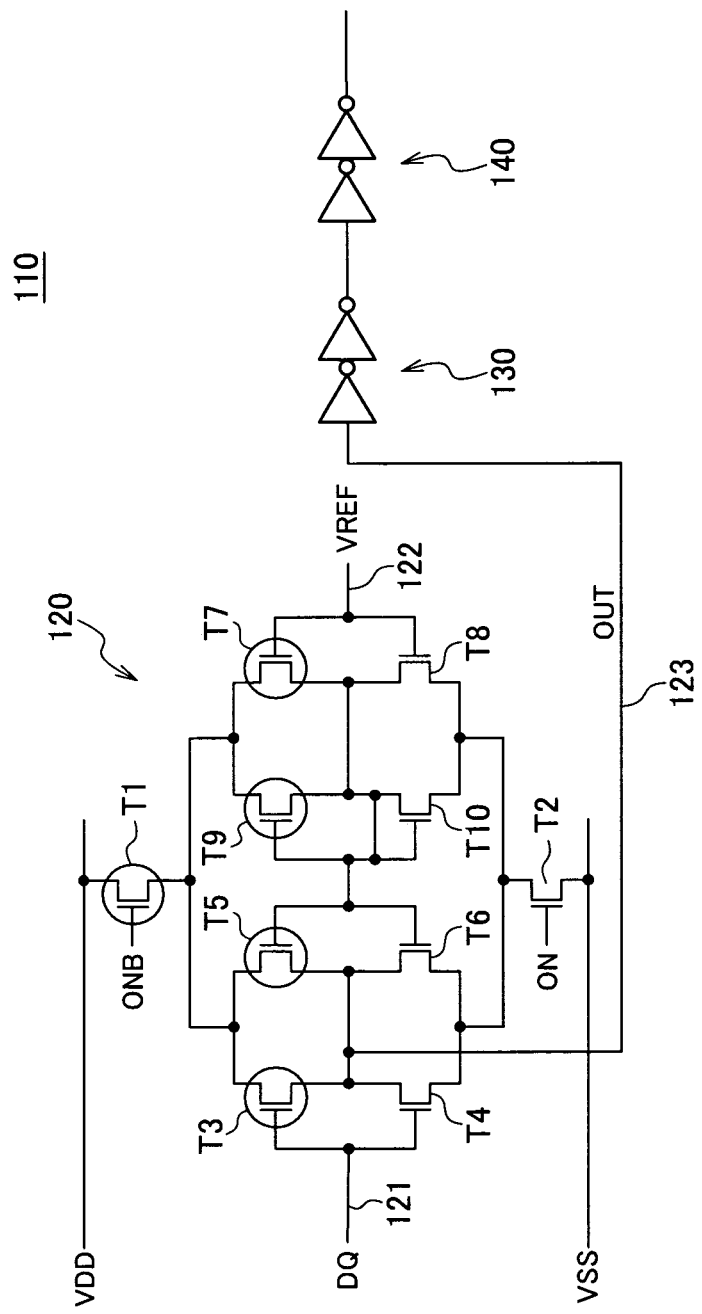
FIG. 5 is a circuit diagram of the input first-stage circuit 110 shown in FIG. 4.

Turning to FIG. 5, the amplifier circuit 120 constituting the input first-stage circuit 110 includes transistors T1 to T10. The waveform generation circuit 130 and the voltage conversion circuit 140 each include two stages of inverters. Among the circuit blocks constituting the input first-stage circuit 110, the amplifier circuit 120 is a particularly sensitive circuit. A plurality of amplifier circuits 120 need to have exactly the same characteristics. In fact, it is the transistors T3 to T10 constituting a differential circuit that need to have exactly the same characteristics among the transistors constituting the amplifier circuit 120. The transistors T1 and T2 are intended to pass an operating current through the amplifier circuit 120, and thus are not as highly sensitive as the transistors T3 to T10 constituting the differential circuit. In the following description, the term "amplifier circuit 120" may sometimes refer to only the transistors T3 to T10.

Among the transistors T1 to T10 constituting the amplifier circuit 120, the odd-numbered transistors T1, T3, T5, T7, and T9 are P-channel MOS transistors. The even-numbered transistors T2, T4, T6, T8, and T10 are N-channel MOS transistors. The transistors T1 and T2 are ones for activating the input first-stage circuit 110. Activation signals ONB and ON are supplied to the gate electrodes of the transistors T1 and T2, respectively. The source of the transistor T1 is connected to the power supply potential VDD. The source of the transistor T2 is connected to the ground potential VSS. If the activation signals ONB and ON are activated to a low level and a high level, respectively, an operating voltage is supplied to the transistors T3 to T10. This makes the transistors T3 to T10 capable of receiving write data DQ. On the other hand, if the activation signals ONB and ON are deactivated to a high level and a low level, respectively, no operating voltage is supplied to the transistors T3 to T10. As a result, the power consumption of the input first-stage circuit 110 falls to near zero.

The transistors T3 to T10 constitute a so-called differential amplifier. As shown in FIG. 5, an input signal, or write data DQ, is supplied to the gate electrodes of the transistors T3 and T4 through an input line 121. The drains of the transistors T3 and T4 are connected in common. The output signal OUT is taken out from the node through an output line 123. The reference potential VREF is supplied to the gate electrodes of the transistors T7 and T8 through an input line 122. The drains of the transistors T7 and 18 are connected in common. The node is connected to the gate electrodes of the transistors T5, T6, T9, and T10 and to the drains of the transistors T9 and T10.

Figure 6:
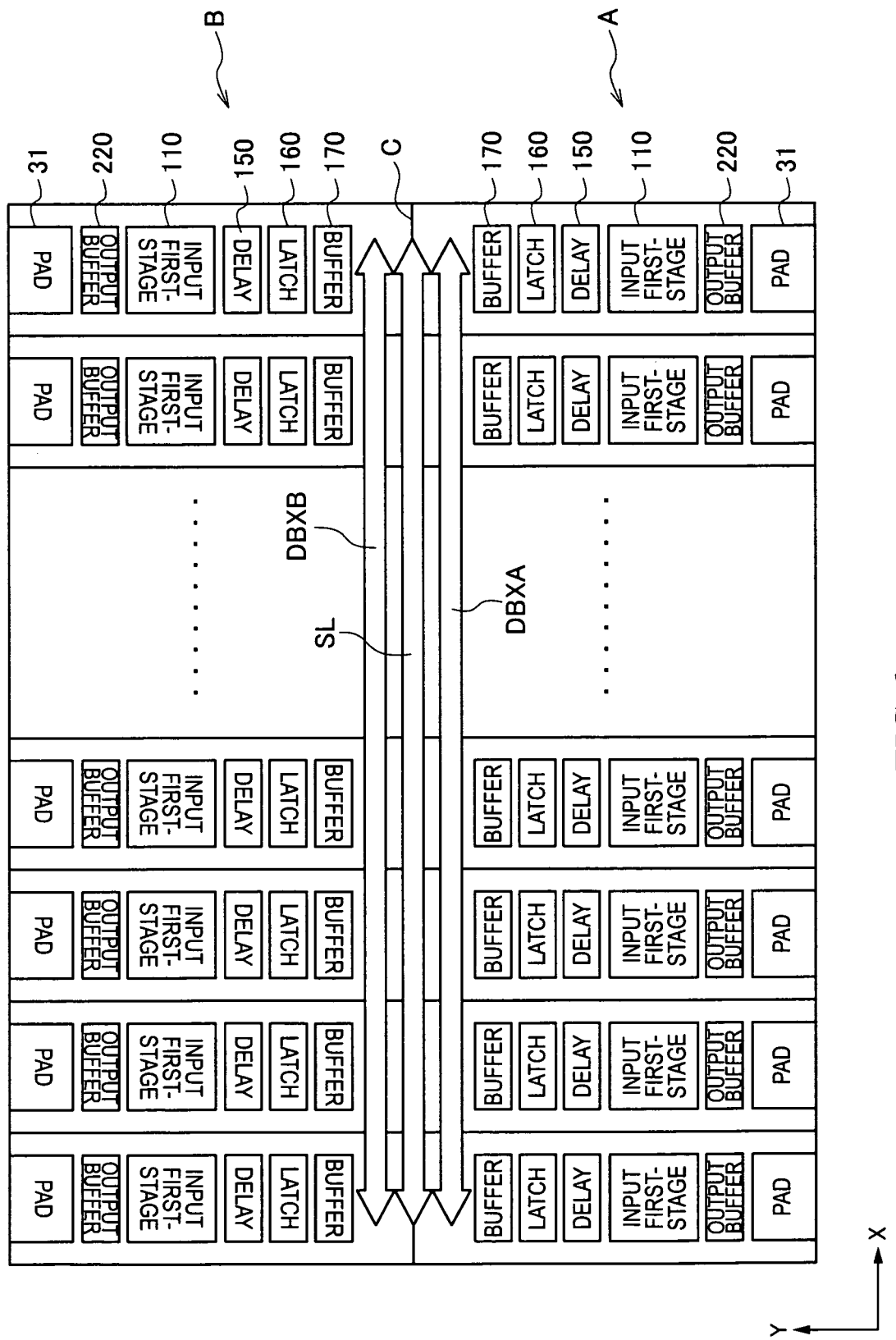
FIG. 6 is a schematic plan view for explaining the layout of the data terminals 31 and the data input/output circuits 30 shown in FIG. 3.

Turning to FIG. 6, the data terminals 31 are arranged in two rows as separate groups A and B. The data input/output circuits 30 are arranged between the two rows of data terminals 31. The data terminals 31 belonging to the group A and the data terminals 31 belonging to the group B correspond to first and second ports, respectively. The groups A and B correspond to first and second circuits, respectively. The group A and the group B are arranged symmetrically about an axis of symmetry C which extends in the X direction. In the group A, the flow of signals from the data terminals 31 to a data bus DBXA is upward in the diagram. In the group B, the flow of signals from the data terminals 31 to a data bus DBXB is downward in the diagram. The input/output nodes of the data buses DBXA and DBXB correspond to first and second nodes, respectively. Signal lines SL are arranged between the data buses DBXA and DBXB so as to extend in the X direction. Clock signals are supplied to the signal lines SL.

Figure 7:
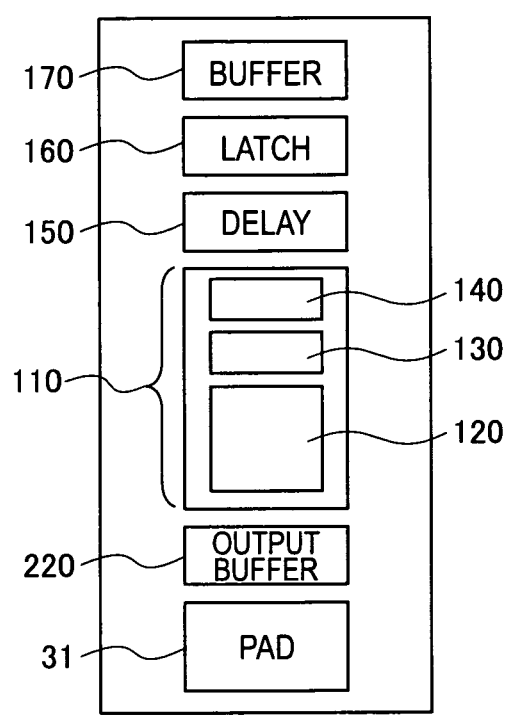
FIG. 7 is a block diagram showing an arrangement of an input first-stage circuit 110 according to a first embodiment.

The internal cell arrangement of the input first-stage circuit 110 shown in FIG. 7 is common to the groups A and B shown in FIG. 6. Specifically, an amplifier circuit 120, a waveform generation circuit 130, and a voltage conversion circuit 140 are laid out in such an order from a data terminal 31 to the axis of symmetry C. It will be understood that a plurality of transistors that constitute an amplifier circuit 120, a waveform generation circuit 130, and a voltage conversion circuit 140 of the group A have the same shapes and sizes as those of a plurality of transistors that constitute an amplifier circuit 120, a waveform generation circuit 130, and a voltage conversion circuit 140 of the group B. That is, the transistors are in the same layout. As for the directions of the transistors, the amplifier circuits 120 of the groups A and B are the same. The waveform generation circuits 130 and the voltage conversion circuits 140 of the groups A and B are symmetrical to each other, i.e., different by 180°. In other words, the input first-stage circuit 110 of the group A and the input first-stage circuit 110 of the group B are not completely symmetrical about the axis of symmetry C in a transistor level but the amplifier circuits 120 are in the same direction.

The layout corresponds to the first embodiment of the present invention will be explained with reference to FIG. 8.

As described above, the transistors T3 to T10 shown in FIG. 8 are ones that constitute a differential amplifier.

Figure 8:
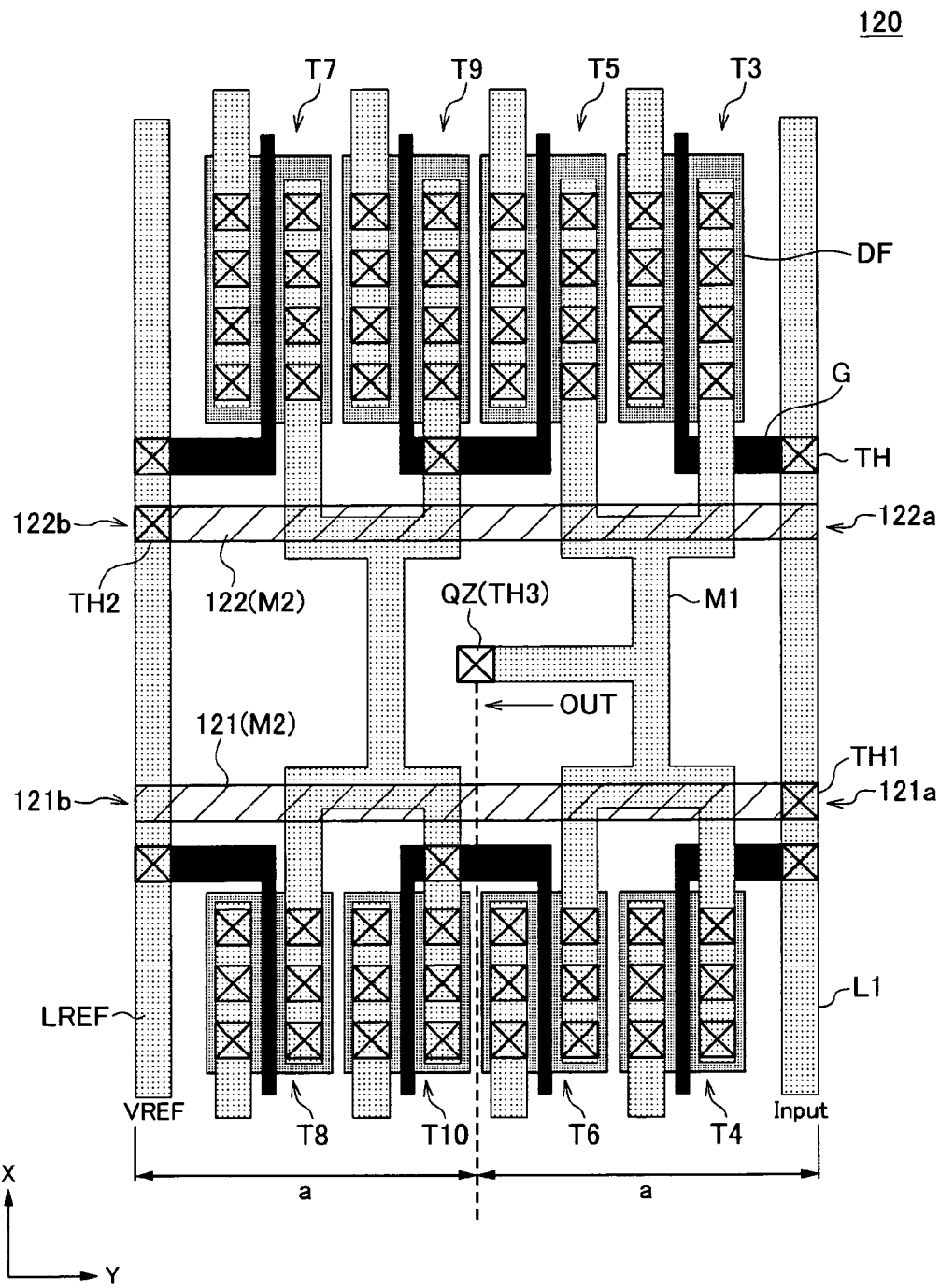
FIG. 8 is a general plan view showing the layout of the transistors T3 to T10 which constitute an amplifier circuit 120 shown in FIG. 7.

In FIG. 8, diffusion layers DF formed in a semiconductor substrate are shown heavily shaded. Gate electrodes G are shown filled. The gate electrodes G constitute wiring in the lowermost layer. A first wiring layer M1 lying in a layer above the gate electrodes G is shown lightly shaded. A second wiring layer M2 lying in a layer above the first wiring layer M1 is shown hatched. Each transistor includes a source and a drain which are made of diffusion layers DF, and a gate electrode G which is arranged between the source and the drain. As shown in FIG. 8, the P-channel transistors T3, T5, T7, and T9 are arranged on the upper side in the X direction. The N-channel transistors T4, T6, T8, and T10 are arranged on the lower side in the X direction. Corresponding pairs of transistors, namely, the transistors T3 and T4, the transistors T5 and T6, the transistors T7 and T8, and the transistors T9 and T10 are arranged in the X direction. The pairs of transistors thus have the same respective Y coordinates. The diffusion layers DF that constitute the transistors T3, T5, T7, and T9 have a greater length (channel width) in the X direction than chat of the diffusion layers DF that constitute the transistors T4, T6, T8, and T10. The reason is that P-channel MOS transistors have a power supply capability lower than that of N-channel MOS transistors.

The gate electrodes G and the diffusion layers DF are connected to the first wiring layer M1 through respective corresponding contact conductors TH. The first wiring layer M1 includes an input line L1 which is arranged at one end (right) in the Y direction and extends in the X direction. The input line L1 is connected to a data terminal 31. The input line L1 is a line to which write data DQ is supplied. The first wiring layer M1 also includes a reference line LREF which is arranged at the other end (left) in the Y direction and extends in the X direction. The reference voltage VREF is supplied to the reference line LREF. The transistors T3 to T10 constituting the amplifier circuit 120 are arranged between the input line L1 and the reference line LREF both of which extend in the X direction. As shown in FIG. 8, the distance between the input line L1 and the reference line LREF in the Y direction is 2a. This means that the cell constituted by the transistors T3 to T10 has a length of 2a in the Y direction.

As shown in FIG. 8, the input line L1 is connected to an input line 121 through a contact conductor TH1. Similarly, the reference line LREF is connected to an input line 122 through a contact conductor TH2. The input lines 121 and 122 are formed on the second wiring layer M2. The input lines 121 and 122 both extend in the Y direction and have a length of 2a. The length is the same as the length of the cell constituted by the transistors T3 to T10 in the Y direction. This makes it possible to supply write data DQ to the input line 121 both from one end 121a and from the other end 121b. Similarly, a reference potential VREF can be supplied to the input line 122 both from one end 122a and from the other end 122b. The wiring loads remain unchanged regardless of which ends the write data DQ and the reference potential VREF are supplied from.

An output terminal QZ of the amplifier circuit 120 is arranged in the center in the Y direction of the cell constituted by the transistors T3 to T10. More specifically, the distance from the input line L1 to the output terminal QZ in the Y direction is a. The distance from the reference line LREF to the output terminal QZ in the Y direction is also a. The output terminal QZ is led out to the second wiring layer M2 through a contact conductor TH3. Since the output terminal QZ is arranged in the center in the Y direction, the wiring load remains the same regardless of whether the output signal OUT of the amplifier circuit 120 is output to the right side of FIG. 3 (the side of the input tine L1) or to the left side of FIG. 3 (the side of the reference line LREF) through the second wiring layer M2.

Consequently, in the cell shown in FIG. 8, the wiring loads of the input lines will not change depending on which side in the Y direction write data DQ and the reference potential VREF are supplied from. The wiring load of the output line will not change, either, regardless of which side in the Y direction the output signal OUT is taken out to. This means that the cell shown in FIG. 8 can be rotated by 180° with no change of the wiring load at all.

Figure 9:
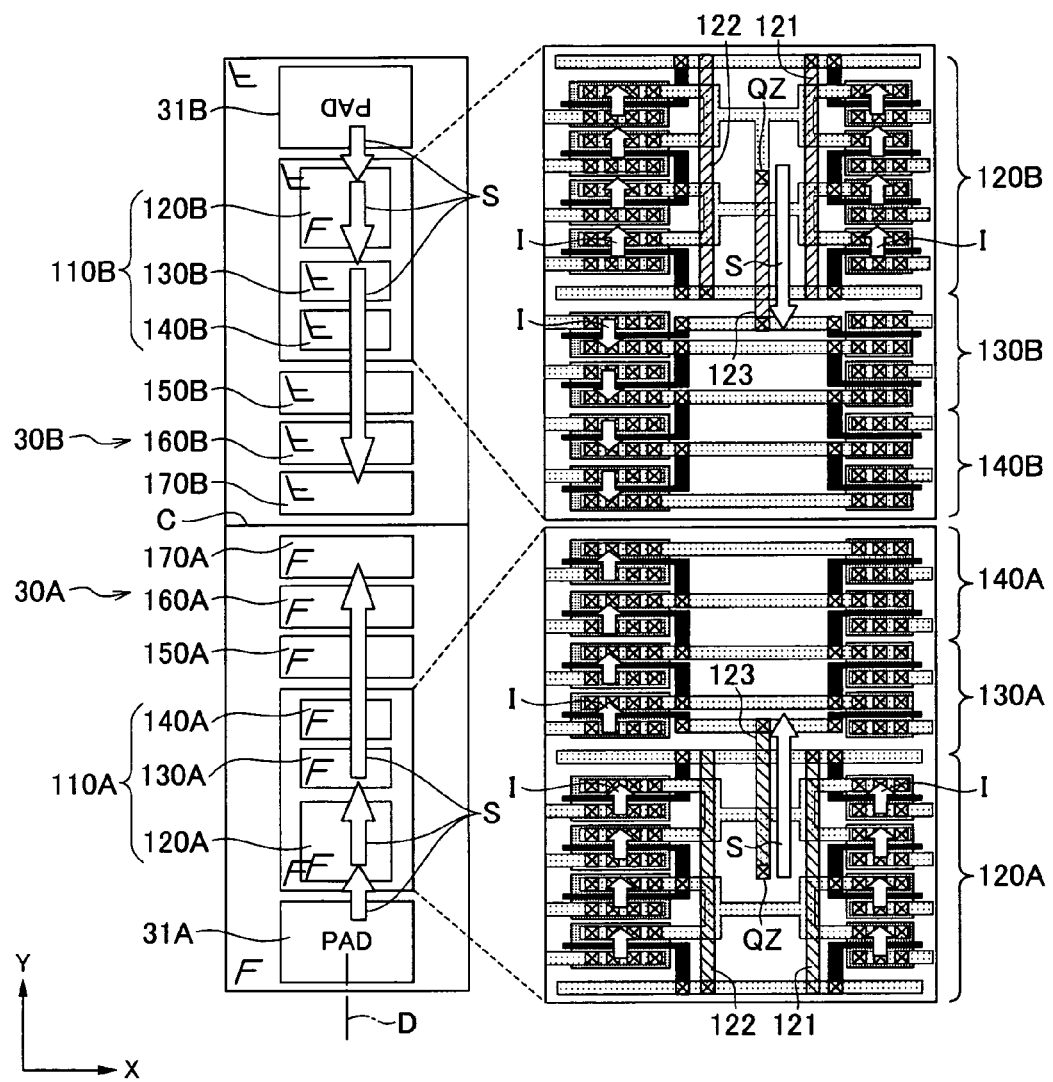
FIG. 9 is a plan view for explaining the layout of two data input/output circuits 30 and data terminals 31 adjoining in the Y direction according to the first embodiment.

Turning to FIG. 9, it shows a data input/output circuit 30A (first circuit) and a data terminal 31A (first port) which belong to the group A, and a data input/output circuit 30B (second circuit) and a data terminal 31B (second port) which belong to the group B. The layout of input first-stage circuits 110A and 110B is shown enlarged to a transistor level. All the cells shown in FIG. 9 are arranged along an axis D (first axis) that extends in the Y direction.

As shown in FIG. 9, the data input/output circuit 30A and the data terminal 31A belonging to the group A and the data input/output circuit 30B and the data terminal 31B belonging to the group B are arranged symmetrically about the axis of symmetry C extending in the X direction (direction orthogonal to the first axis). Specifically, the data input/output circuit 30A includes an input first-stage circuit 110A, a delay circuit 150A, a latch circuit 160A, and a buffer circuit 170A which are arranged in such an order from the data terminal 31A to the axis of symmetry C. The data input/output circuit 30B includes an input first-stage circuit 110B, a delay circuit 150B, a latch circuit 160B, and a buffer circuit 170B which are arranged in such an order from the data terminal 31B to the axis of symmetry C. The cells that constitute the input first-stage circuits 110A and 110B are also symmetrically arranged. Specifically, the input first-stage circuit 110A includes an amplifier circuit 120A, a waveform generation circuit 130A, and a voltage conversion circuit 140A which are arranged in such an order from the data terminal 31A to the axis of symmetry C. The input first-stage circuit 110B includes an amplifier circuit 120B, a waveform generation circuit 130B, and a voltage conversion circuit 140B which are arranged in such an order from the data terminal 31B to the axis of symmetry C.

Write data DQ is supplied to the amplifier circuit 120A of the group A from below in the diagram. Write data DQ is supplied to the amplifier circuit 120B of the group B from above in the diagram. Since the input lines 121 of the groups A and B have the same length, the signal loads on the input lines 121 of the groups A and B coincide with each other. The same holds for the input lines 122 for supplying the reference potential VREF. The output terminals QZ of the amplifier circuits 120A and 120B are connected to the waveform generation circuits 130 in the next stage through output lines 123. As mentioned previously, the output terminals QZ are arranged in the centers of the amplifier circuits 120 in the Y direction. The output lines 123 of the groups A and B thus have the same length. Consequently, the signal loads on the output lines 123 of the groups A and B also coincide with each other.

The arrows S shown in FIG. 9 indicate the directions of flow of signals. The arrows I shown in FIG. 9 indicate the directions of flow of currents. The directions of the cells other than the amplifier circuits 120 (the waveform generation circuits 130, voltage conversion circuits 140, delay circuits 150, latch circuits 160, and buffer circuits 170) will now be described. The directions (indicated by the symbols "F") of the cells belonging to the group A are 180° different from those of the cells belonging to the group B. More specifically, the plurality of transistors included in the cells are laid out with the same shapes and sizes but in 180° different directions. The layout of the transistors in 180° different directions means that the directions of currents the transistors pass (the directions indicated by the arrows I) are opposite to each other. In other words, such cells of the groups A and B are symmetrically arranged in a transistor level.

On the other hand, as shown in FIG. 9, the transistors included in the amplifier circuits 120A and 120B are the same not only in shape and size but also in direction. The layout of the transistors in the same directions means that the directions of currents the transistors pass (the directions indicated by the arrows I) are the same. In other words, the amplifier circuits 120 of the groups A and B are in a shift arrangement in a transistor level.

With the foregoing layout, the signals of the groups A and B flow in 180° different directions (the directions indicated by the arrows S). This makes the propagation distances of the signals in the groups A and B the same. The directions of the currents flowing in the amplifier circuits 120 of the groups A and B (the directions indicated by the arrows I) are also the same, which prevents even a slight difference in characteristic due to a difference in the direction or currents. Meanwhile, the directions of the currents flowing through the waveform generation circuits 130 and the voltage conversion circuits 140 of the groups A and B (the directions indicated by the arrows I) are 180° different from each other.

Now, the reason why a difference in the direction of currents (directions indicated by the arrows I) causes a difference in characteristic will be described.

Figure 10A:
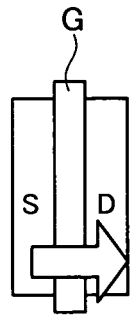
FIGS. 10A and 10B are plan views of a MOS transistor with a single gate electrode G.
Figure 10B:
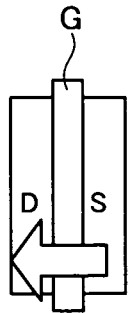

Turning to FIGS. 10A and 10B, transistors having the same layout whereas the sources S and drains D are in reverse positions are shown. Specifically, FIG. 10A shows a case where the source S is on the left and the drain D on the right. When the transistor turns ON, a current flows from the left to the right. FIG. 10B shows a case where the drain D is on the left and the source S on the right. When the transistor turns ON, a current flows from the right to the left.

Figure 11A:
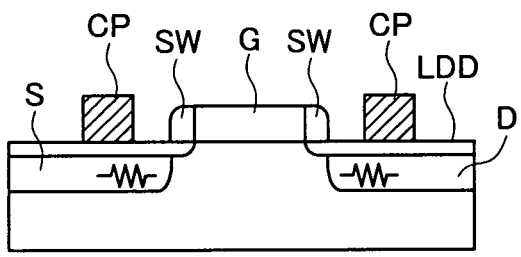
FIGS. 11A to 11C are sectional views showing the structure of a MOS transistor.

As shown in FIG. 11A, sidewall insulation films SW are arranged on both sides of the gate electrode G of the MOS transistor. The source S and the drain D are formed in a self-aligned manner with respect to the sidewall insulation films SW. The sidewall insulation films SW are an insulator needed to form LDD regions. The source S and the drain D are connected to an upper wiring layer through contact plugs CP. Suppose, as shown in FIG. 11A, that the sidewall insulation films SW on the source side and the drain side have the same thickness and the contact plugs CP on the source side and the drain side are symmetrically positioned. In such a case, no change occurs in characteristic regardless of which diffusion layer is used as the source or drain. That is, characteristics will not change depending on the current direction.

Figure 11B:
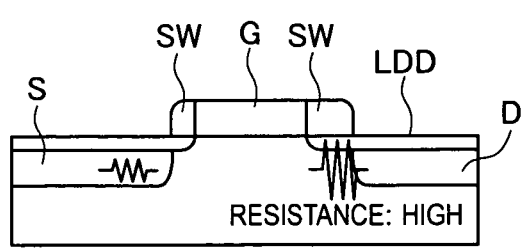
Figure 11C:
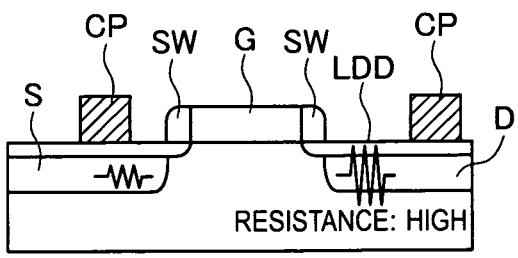

If, as shown in FIG. 11B, the sidewall insulation films SW on the source side and the drain side have substantially different thicknesses, then the source S and the drain D have substantially different resistances. Such a difference in thickness between the sidewall insulation films SW occurs due to process conditions, and is thus difficult to resolve completely. The source S and the drain D also have substantially different resistances if the contact plugs CP on the source side and the drain side are in substantially asymmetrical positions as shown in FIG. 11C. Such a difference in position between contact plugs CP also occurs due to process conditions, and is thus difficult to resolve completely. When the source S and the drain D have different resistances, characteristics change depending on which diffusion layer is used as the source or drain. That is, characteristics change depending on the current direction.

Figure 12A:
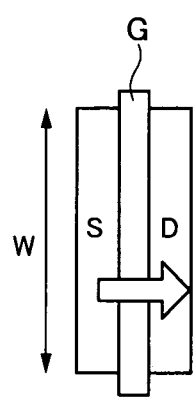
FIGS. 12A to 12C are plan views of MOS transistors having one gate electrode, two gate electrodes, and three gate electrodes, respectively.
Figure 12B:
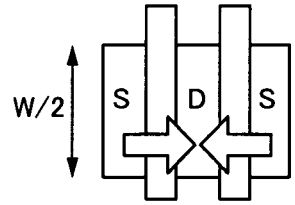
Figure 12C:
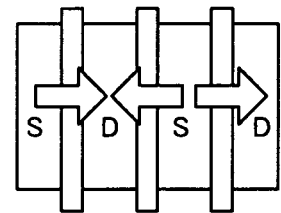

One of the methods for solving the foregoing problem is to divide the gate electrode into two. Specifically, a gate electrode G having a channel width of W as shown in FIG. 12A may be divided into two gate electrodes G having a channel width of W/2 as shown in FIG. 12B to constitute a double gate structure. According to such a method, a current flowing from the right to the left and a current flowing from the left to the right cancel out characteristic differences due to current directions. It should be noted that it is not always possible to divide a gate electrode into two because of layout constraints. Transistors often need to be configured with a single gate electrode as shown in FIG. 12A. In particular, the transistors T3 to T10 constituting the amplifier circuits 120 need to be designed with small transistor sizes for the sake of current reduction. If such small transistors are formed in a double gate structure, the resulting smaller channel widths can cause a reverse narrow channel effect. The transistors T3 to T10 constituting the amplifier circuits 120 therefore often need to employ a single gate structure. In some cases, a gate electrode may need to be divided into three as shown in FIG. 12C due to layout constraints. In such cases, there are an odd number of gate electrodes and it is not possible to completely cancel out differences in characteristic due to current directions.

In contrast, according to the layout of the present embodiment, the amplifier circuits 120, which are extremely sensitive circuits, have the same current directions (directions indicated by the arrows I) regardless of which group the amplifier circuits 120 belong to, group A or group B. The amplifier circuits 120 thus have the same characteristics regardless of the number of gate electrodes. In addition, the symmetrical arrangement of the cells between the groups A and B makes the flows of signals (directions indicated by the arrows S) in the groups A and B symmetrical. This consequently makes the propagation distances of the signals in the groups A and B the same.

Figure 13:
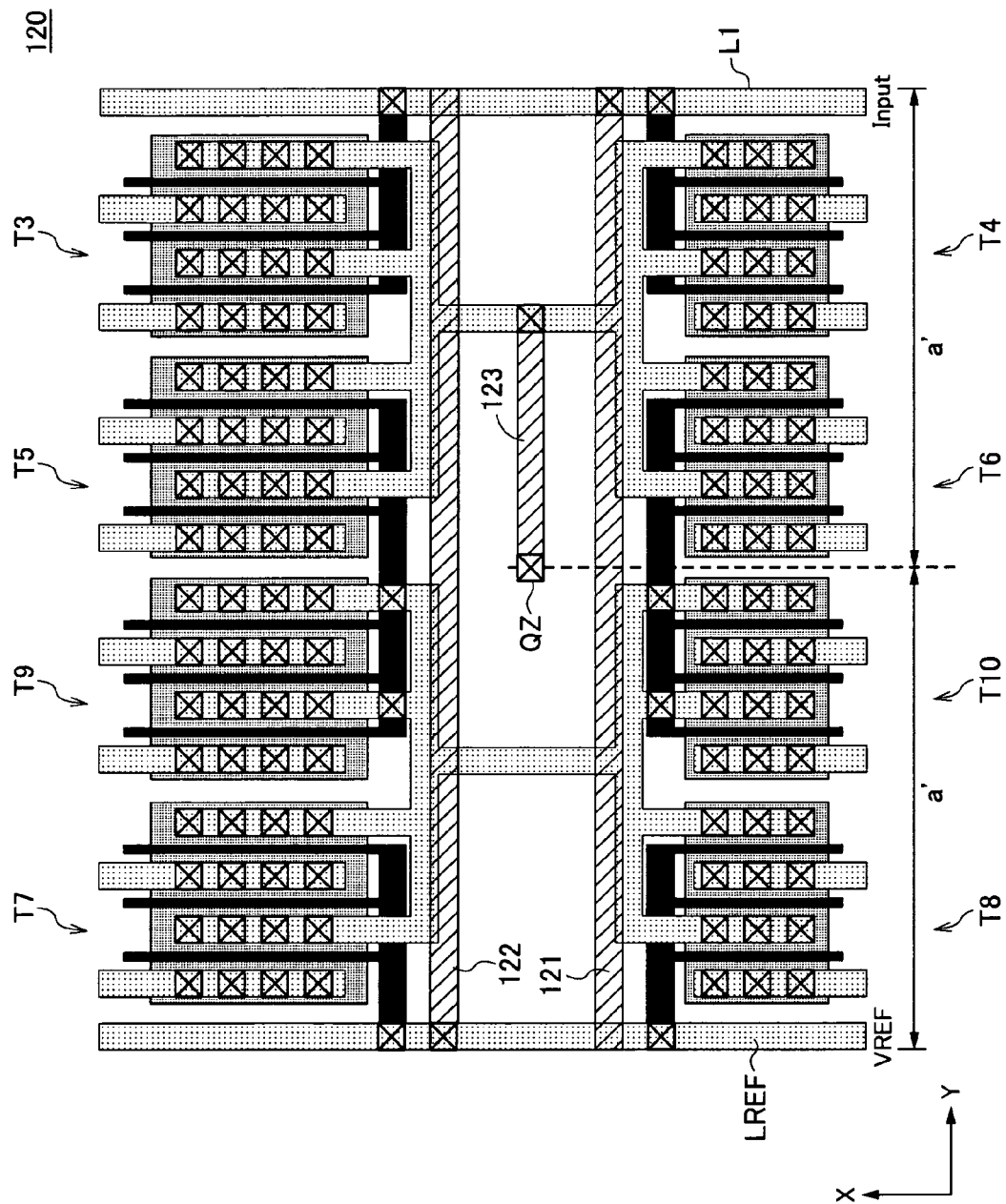
FIG. 13 is a general plan view showing an example where the gate electrodes of the transistors T3 to T10 constituting an amplifier circuit 120 are each divided into three.

Turning to FIG. 13, dividing the gate electrodes of the transistors T3 to T10 into three each increases the lengths of the transistors T3 to T10 in the Y direction. The length of the cell constituted by the transistors T3 to T10 in the Y direction is thereby increased to $2a'$ ($>2a$). Even in such a case, write data DQ and the reference potential VREF can be supplied from either of the ends without a change in wiring load if the length of the input lines 121 and 122 extending in the Y direction is increased to $2a'$, substantially the same length as that of the cell constituted by the transistors T3 to T10 in the Y direction. The length $2a'$ of the input lines 121 and 122 is located inside the cell with some margin from the cell frame (not shown) of the amplifier circuit 120. The margin is intended to avoid a contact with wiring patterns of adjacent cell frames. The length of the input lines 121 and 122 is thus substantially the same as the length of the cell including the input lines.

The output terminal QZ of the amplifier circuit 120 is arranged substantially in the center in the Y direction of the cell constituted by the transistors T3 to T10. In the example shown in FIG. 13, an output line 123 using the second wiring layer M2 is used to arrange the output terminal QZ in the center of the cell. Consequently, the distance from the input line L1 to the output terminal QZ in the Y direction is $a'$. The distance from the reference line LREF to the output terminal QZ in the Y direction is also $a'$. The wiring load therefore remains unchanged regardless of which side in the Y direction the output signal OUT is transmitted to.

Figure 14:
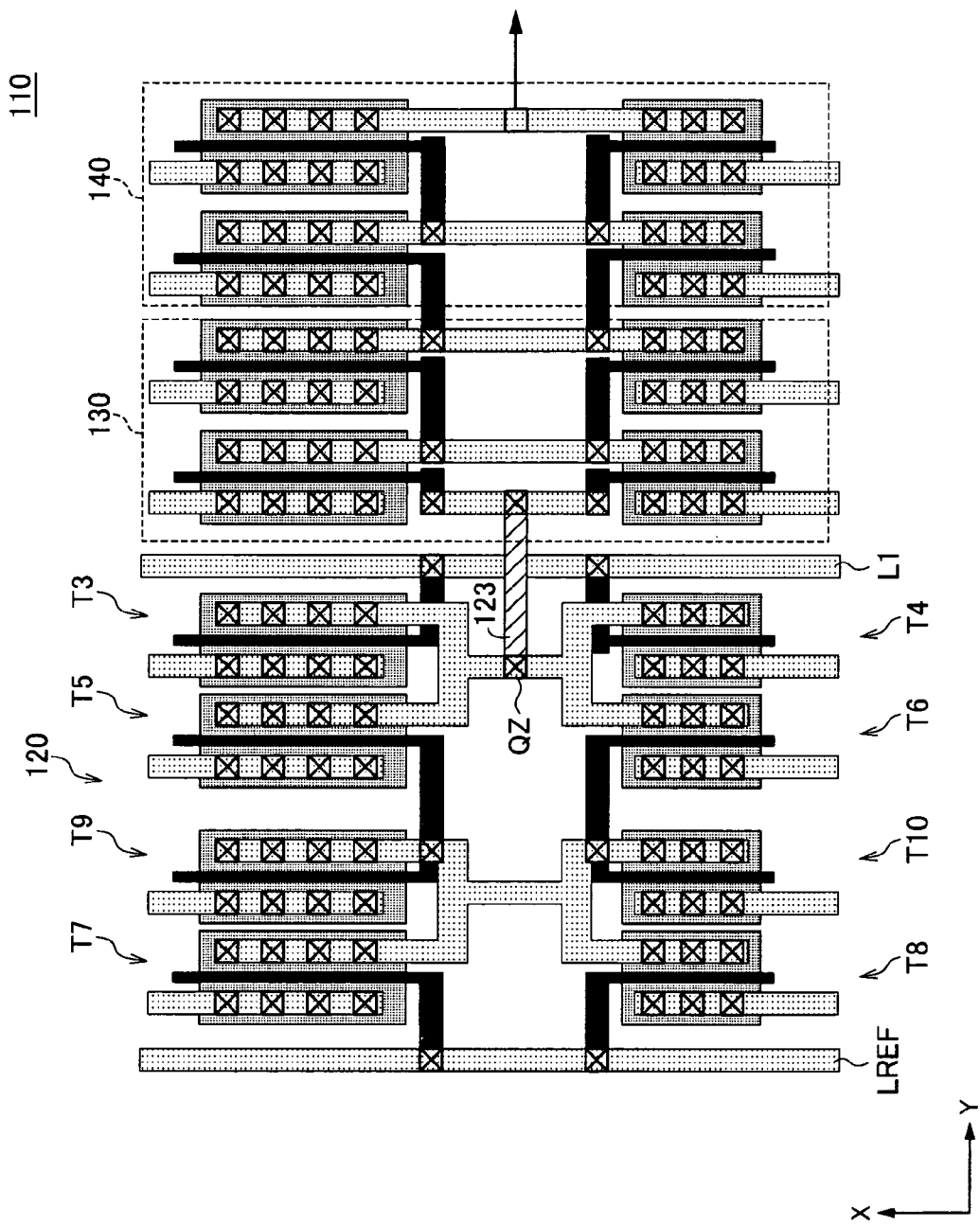
FIG. 14 is a general plan view showing the layout of an input first-stage circuit 110 that the inventors have conceived as a prototype in the course of making the present invention.

In a device shown in FIG. 14 that the inventors have conceived as a prototype in the course of making the present invention. Note that the transistors T1 and T2 included in the amplifier circuit 120 are omitted in FIG. 14.

Unlike the layout shown in FIG. 8, the prototype shown in FIG. 14 does not include the input lines 121 and 122 of the second wiring layer M2. The output terminal QZ is arranged with an offset, at a position off the center in the Y direction of the cell constituted by the transistors T3 to T10. Specifically, the output terminal QZ is offset toward the waveform generation circuit 130. This reduces the wiring length of the output line 122.

Figure 15:
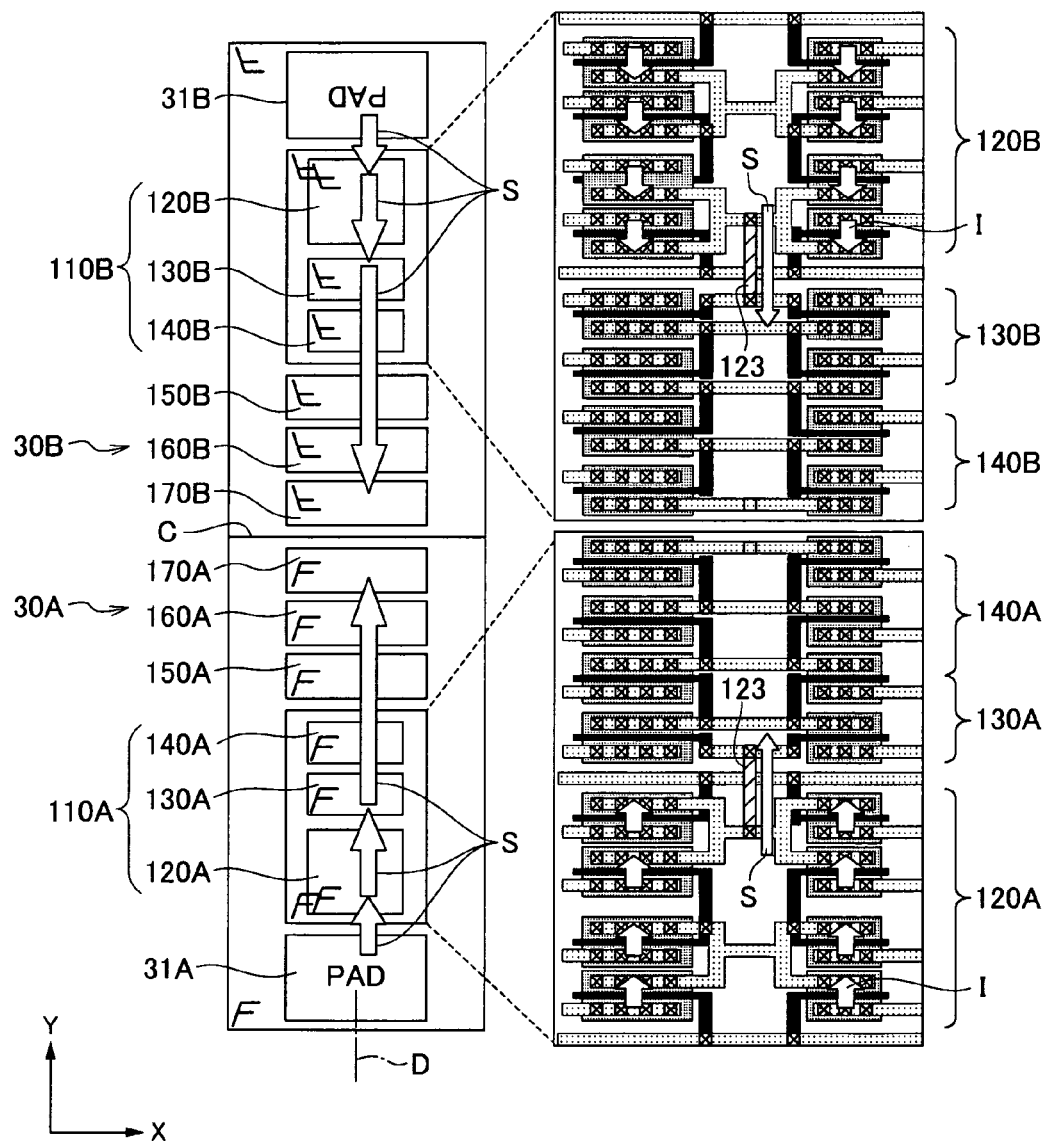
FIG. 15 is a plan view for explaining the layout of two data input/output circuits 30 and data terminals 31 adjoining in the Y direction according to a first prototype.

Turning to FIG. 15, the layout of two data input/output circuits 30 and data terminals 31 adjoining in the Y direction is shown according to the first prototype.

In the first prototype shown in FIG. 15, the data input/output circuit 30A and the data terminal 31A belonging to the group A and the data input/output circuit 30B and the data terminal 31B belonging to the group B are arranged to be perfectly symmetrical in a transistor level about the axis of symmetry C extending in the X direction. More specifically, the plurality of transistors included in the cells are laid out with the same shapes and sizes and in 180° different directions.

According to such a layout, the signals of the groups A and B flow in 180° different directions as indicated by the arrows S. This makes the propagation distances of the signals in the groups A and B the same. It should be noted that the currents of the groups A and B also flow in 180° (different directions as indicated by the arrows I. Extremely sensitive cells such as the amplifier circuits 120 can thus cause a slight difference in characteristic due to a difference in the direction of currents because of the reason that has been described with reference to FIGS. 10A to 12C.

Figure 16:
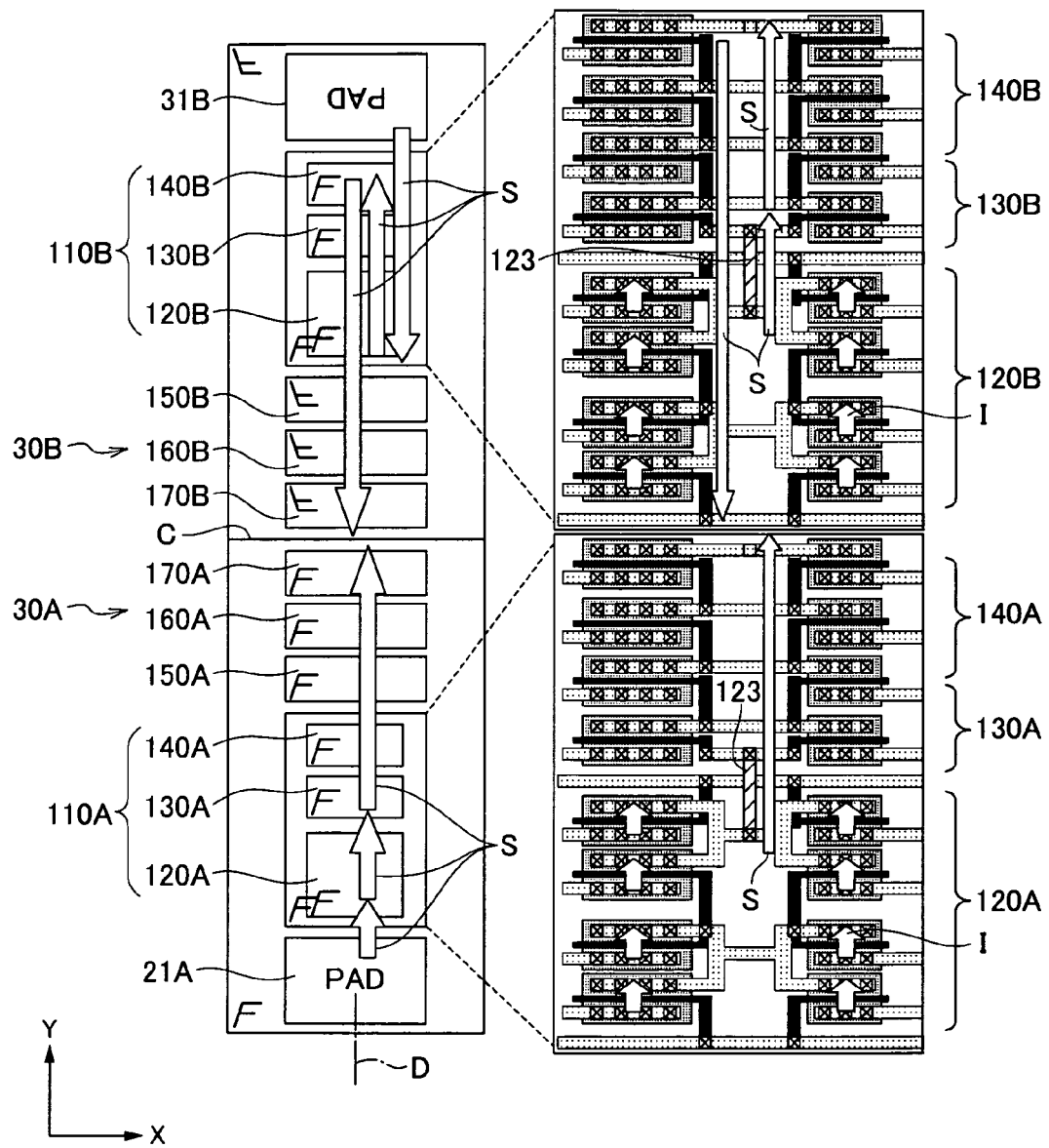
FIG. 16 is a plan view for explaining the layout of two data input/output circuits 30 and data terminals 31 adjoining in the Y direction according to a second prototype.

Turning to FIG. 16, the layout of two data input/output circuits 30 and data terminals 31 adjoining in the Y direction is shown according to the second prototype.

In the second prototype shown in FIG. 16, the input first-stage circuits 110 of the groups A and B are in a shift arrangement. In other words, all the transistors constituting the input first-stage circuits 110 of the groups A and B have the same shapes and sizes and are in the same directions.

As indicated by the arrows I, the directions of the currents flowing in the input first-stage circuits 110 of the groups A and B are the same. There occurs no difference in characteristic due to a difference in the direction of currents. However, since the signals flow quite differently in the groups A and B as indicated by the arrows S, a large difference occurs in the propagation distances of the signals in the groups A and B. This produces a substantial difference in characteristic between the groups A and B.

Unlike the first and second prototypes, the layout of the foregoing first embodiment is such that the signals of the groups A and B flow in 180° different directions and the currents in the sensitive amplifier circuits 120 of the groups A and B flow in the same directions. It is therefore possible to make the propagation distances of the signals in the groups A and B the same while resolving a slight difference in characteristic due to a difference in the direction of currents.

Next, a second preferred embodiment of the present invention will be described.

Figure 17:
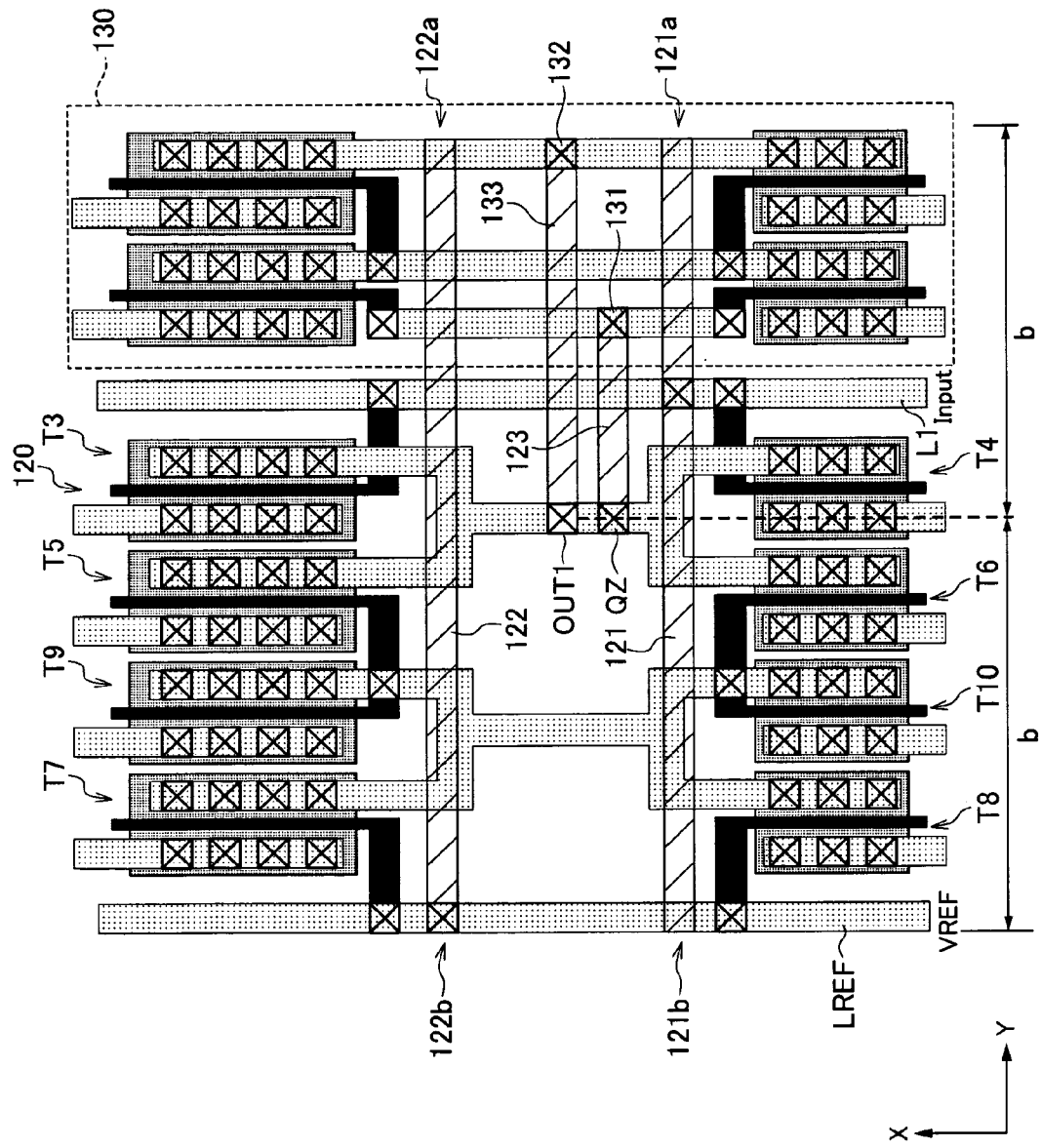
FIG. 17 is a general plan view showing the layout of an amplifier circuit 120 and a waveform generation circuit 130 according to a second embodiment of the present invention.

Turning to FIG. 17, there is a general plan view showing the layout of an amplifier circuit 120 and a waveform generation circuit 130. The layout corresponds to the second embodiment of the present invention. Note that the transistors T1 and T2 included in the amplifier circuit 120 are omitted in FIG. 17.

As shown in FIG. 17, according to the present embodiment, an amplifier circuit 120 and a waveform generation circuit 130 are regarded as a single circuit block. The circuit block is laid out so as not to change in wiring load even when rotated by 180°. Specifically, suppose that the length of the circuit block constituted by the amplifier circuit 120 and the waveform generation circuit 130 in the Y direction is 2b. The length of the input lines 121 and 122 extending in the Y direction is also designed to be 2b. Like the first embodiment, write data DQ can thus be input from either of the ends 121a and 121b of the input line 121. The reference potential VREF can be supplied from either of the ends 122a and 122b of the input line 122. The wiring loads remain unchanged regardless of which ends the write data DQ and the reference potential VREF are supplied from.

In the present embodiment, the output terminal QZ of the amplifier circuit 120 is not arranged in the center of the amplifier circuit 120 in the Y direction but is offset toward the waveform generation circuit 130. The output terminal QZ is connected to the input terminal 131 of the waveform generation circuit 130 through the output line 123 which is formed in the second wiring layer M2. Such an offset arrangement minimizes the wiring resistance of the output line 123 which connects the amplifier circuit 120 and the waveform generation circuit 130. An output terminal 132 of the waveform generation circuit 130 is connected to an output terminal OUT1 of the circuit block through an output line 133 which is formed in the second wiring layer M2. The output terminal OUT1 is arranged in the center in the Y direction. The distances from respective ends of the circuit block in the Y direction to the output terminal OUT1 are both b. Consequently, the wiring load remains the same regardless of whether an output signal OUT of the waveform generation circuit 130 is output to the right side of FIG. 17 (the side of the waveform generation circuit 130) or to the left side of FIG. 17 (the side of the amplifier circuit 120) through the second wiring layer M2.

Consequently, the wiring load of the cell shown in FIG. 17 will not change depending on which side in the Y direction write data DQ and the reference potential VREF are supplied from. The wiring load of the cell will not change, either, regardless of which side in the Y direction the output signal OUT is taken out to. This means that the cell shown in FIG. 17 can be rotated by 180° with no change of the wiring load at all.

Figure 18:
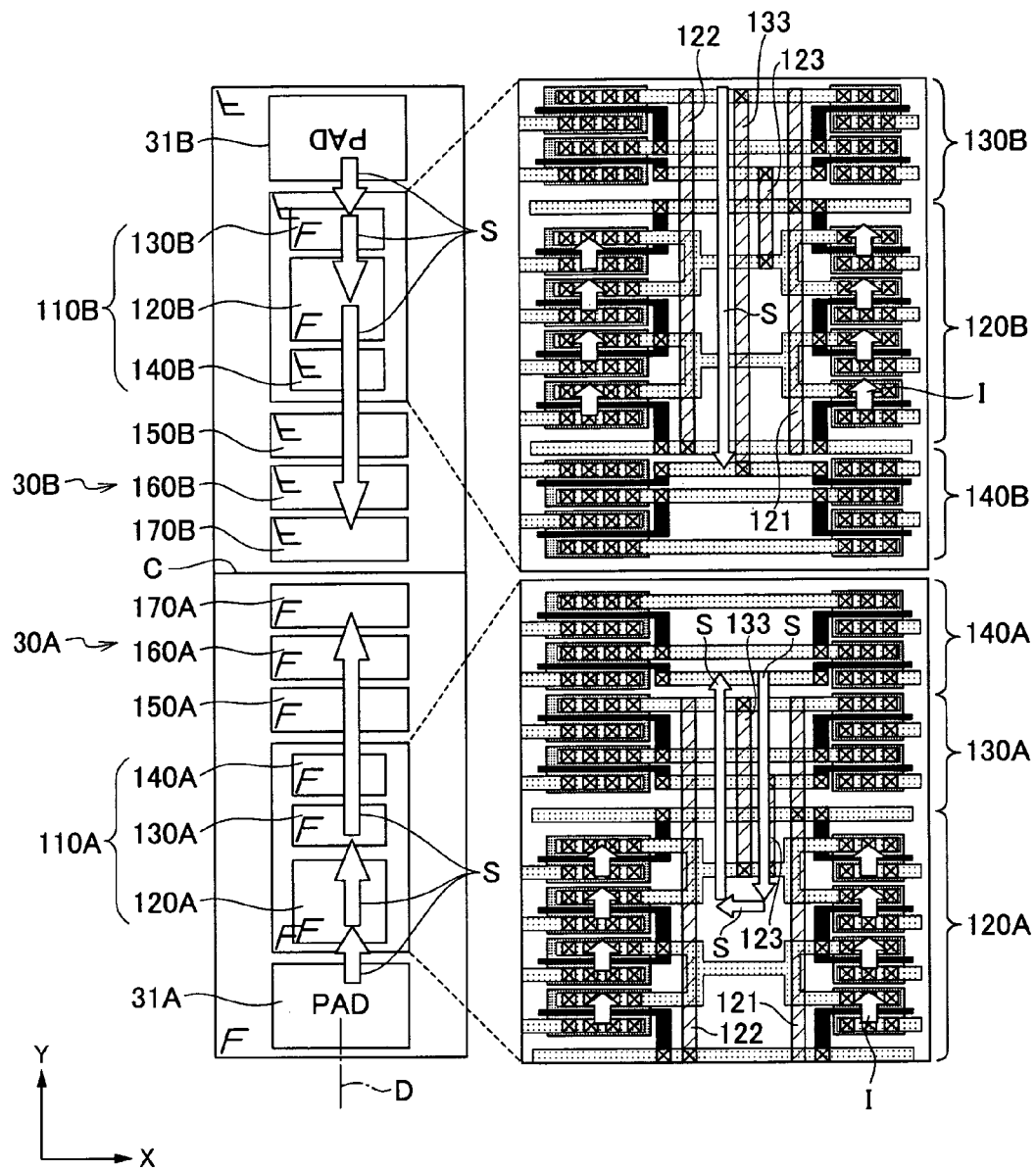
FIG. 18 is a plan view for explaining the layout of two data input/output circuits 30 and data terminals 31 adjoining in the Y direction according to the second embodiment.

Turning to FIG. 18, the data input/output circuit 30A and the data terminal 31A belonging to the group A and the data input/output circuit 30B and the data terminal 31B belonging to the group B are arranged symmetrically about the axis of symmetry C extending in the X direction. The amplifier circuits 120 and the waveform generation circuits 130 are regarded as respective single circuit blocks and put in a shift arrangement. The data input/output circuit 30A includes an amplifier circuit 120A, a waveform generation circuit 130A, a voltage conversion circuit 140A, a delay circuit 150A, a latch circuit 160A, and a buffer circuit 170A which are arranged in such an order from the data terminal 31A to the axis of symmetry C. The data input/output circuit 30B includes a waveform generation circuit 130B, an amplifier circuit 120B, a voltage conversion circuit 140B, a delay circuit 150B, a latch circuit 160B, and a buffer circuit 170B which are arranged in such an order from the data terminal 31B to the axis of symmetry C.

The directions of the cells other than the amplifier circuits 120 and the waveform generation circuits 130 (the voltage conversion circuits 140, delay circuits 150, latch circuits 160, and buffer circuits 170) will now be described. The directions of the cells belonging to the group A are 180° different from those of the cells belonging to the group B. More specifically, the plurality of transistors included in the cells are laid out with the same shapes and sizes but in 180° different directions. In other words, such cells of the groups A and B are symmetrically arranged in a transistor level.

On the other hand, as shown in FIG. 18, the transistors included in the amplifier circuits 120A and 120B and the waveform generation circuits 130A and 130B are the same not only in shape and size but also in direction. In other words, the amplifier circuits 120 and the waveform generation circuits 130 of the groups A and B are in a shift arrangement in a transistor level.

With the foregoing layout, the signals of the groups A and B flow in 180° different directions. This makes the propagation distances of the signals in the groups A and B the same. The directions of the currents flowing in the amplifier circuits 120 and the waveform generation circuits 130 of the groups A and B are also the same, which prevents even a slight difference in characteristic due to a difference in the direction of currents. As a result, the present embodiment provides a layout that is suitable when differences in characteristic due to a difference in the direction of currents need to be cancelled out even in the waveform generation circuits 130. Note that the input lines 121 and 122 become somewhat longer than in the first embodiment.

Next, a third preferred embodiment of the present invention will be described.

Figure 19:
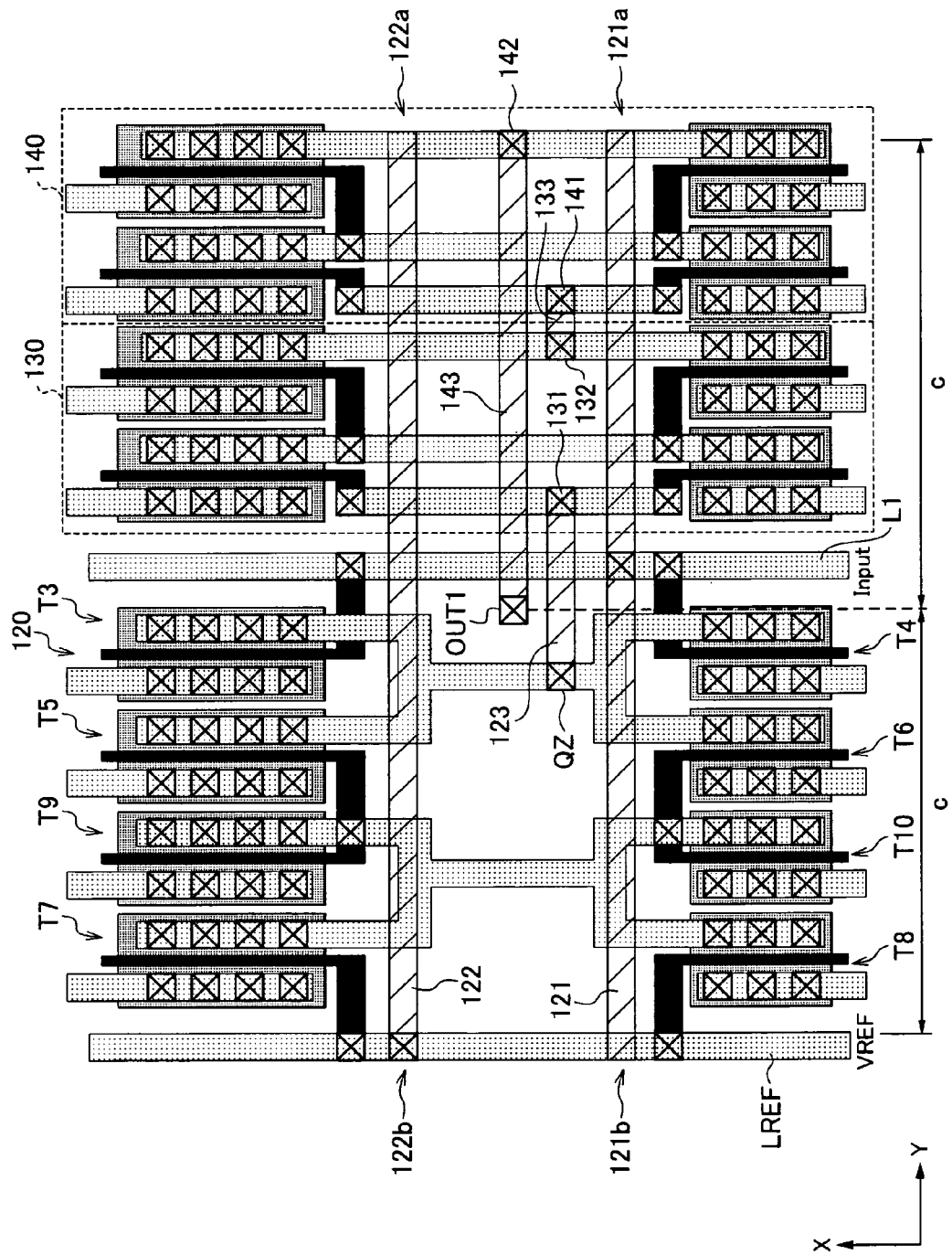
FIG. 19 is a general plan view showing the layout of an input first-stage circuit 110 according to a third embodiment of the present invention.

Turning to FIG. 19, there is a general plan view showing the layout of an input first-stage circuit 110. The layout corresponds to the third embodiment of the present invention. Note that the transistors T1 and T2 included in the amplifier circuit 120 are omitted in FIG. 19.

As shown in FIG. 19, according to the present embodiment, the input first-stage circuit 110 is regarded as a single circuit block. The input first-stage circuit 110 is laid out so as not to change in wiring load even when rotated by 180° Specifically, suppose that the length of the circuit block constituted by the amplifier circuit 120, the waveform generation circuit 130, and the voltage conversion circuit 140 in the Y direction is 2c. The length of the input lines 121 and 122 extending in the Y direction is also designed to be 2c. Like the first and second embodiments, write data DQ can thus be input from either of the ends 121a and 121b of the input line 121. The reference potential VREF can be supplied from either of the ends 122a and 122b of the input line 122. The wiring loads remain unchanged regardless of which ends the write data DQ and the reference potential VREF are supplied from.

In the present embodiment, neither the output terminal QZ of the amplifier circuit 120 nor the output terminal 132 of the waveform generation circuit 130 is arranged in the center of the circuit block in the Y direction. The output terminal QZ of the amplifier circuit 120 is offset toward the waveform generation circuit 130. The output terminal 132 of the waveform generation circuit 130 is offset toward the voltage conversion circuit 140. The output terminal QZ is connected to the input terminal 131 of the waveform generation circuit 130 through the output line 123 which is formed in the second wiring layer M2. The output terminal 132 is connected to an input terminal 141 of the voltage conversion circuit 140 through the output line 133 which is formed in the second wiring layer M2. Such an offset arrangement minimizes the wiring resistances of the output lines 123 and 133.

An output terminal 142 of the voltage conversion circuit 140 is connected to an output terminal OUT1 of the circuit block through an output line 143 which is formed in the second wiring layer M2. The output terminal OUT1 is arranged in the center in the Y direction. The distances from respective ends or the circuit block in the Y direction to the output terminal OUT1 are both c. Consequently, the wiring load remains the same regardless of whether an output signal OUT of the voltage conversion circuit 140 is output to the right side of FIG. 19 (the side of the voltage conversion circuit 140) or to the left side of FIG. 19 (the side of the amplifier circuit 120) through the second wiring layer M2.

Consequently, the wiring load of the cell shown in FIG. 19 will not change depending on which side in the Y direction write data DQ and the reference potential VREF are supplied from. The wiring load of the cell will not change, either, regardless of which side in the Y direction the output signal OUT is taken cut to. This means that the cell shown in FIG. 19 can be rotated by 180° with no change of the wiring load at all.

Figure 20:
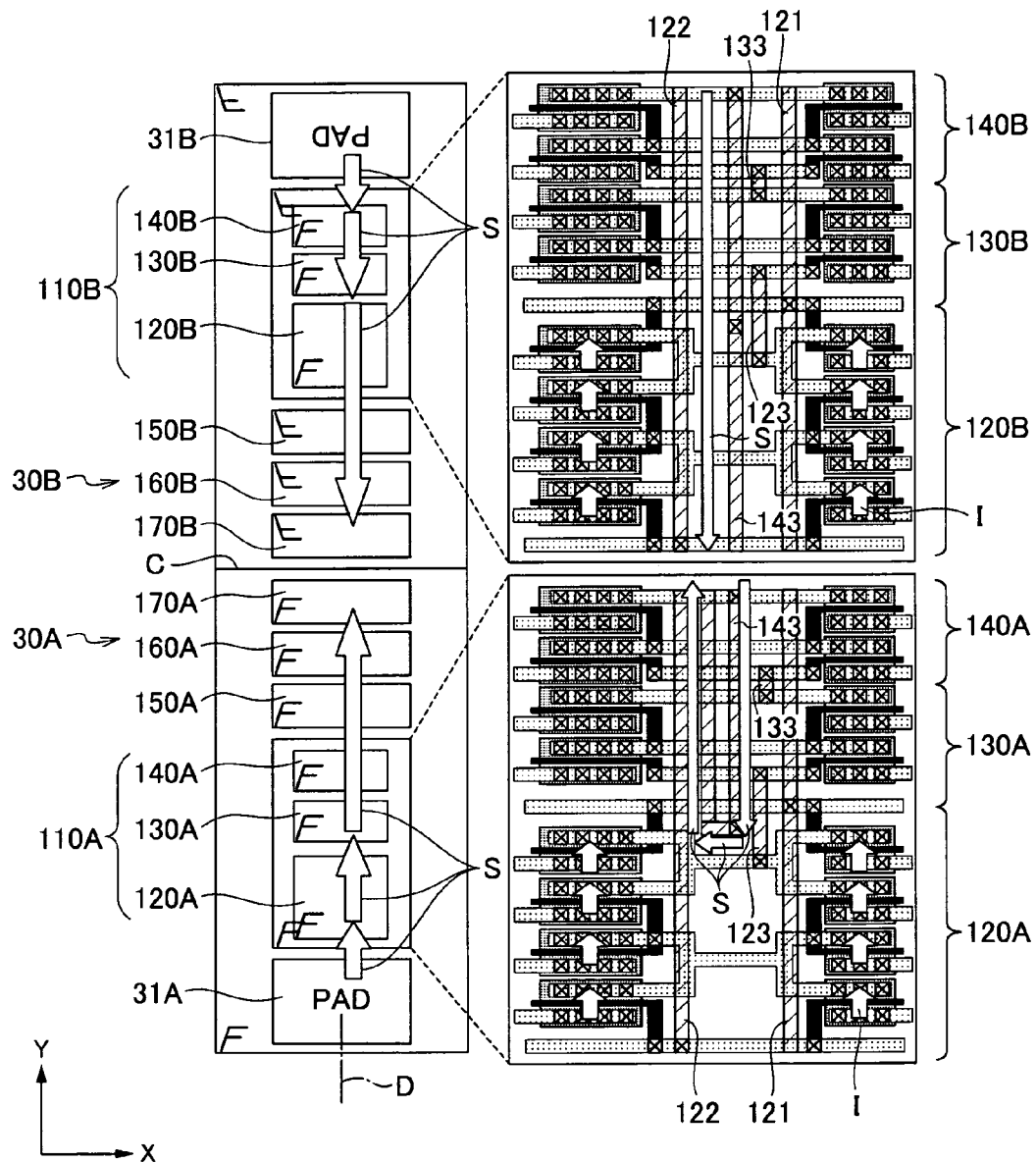
FIG. 20 is a plan view for explaining the layout of two oat a input/output circuits 30 and data terminals 31 adjoining in the Y direction according to the third embodiment.

Turning to FIG. 20, the data input/output circuit 30A and the data terminal 31A belonging to the group A and the data input/output circuit 30B and the data terminal 31B belonging to the group B are arranged symmetrically about the axis of symmetry C extending in the X direction. The input first-stage circuits 110 are regarded as respective circuit blocks and put in a shift arrangement. The data input/output circuit 30A includes an amplifier circuit 120A, a waveform generation circuit 130A, a voltage conversion circuit 140A, a delay circuit 150A, a latch circuit 160A, and a buffer circuit 170A which are arranged in such an order from the data terminal 31A to the axis of symmetry C. The data input/output circuit 30B includes a voltage conversion circuit 140B, a waveform generation circuit 130B, an amplifier circuit 120B, a delay circuit 150B, a latch circuit 160B, and a buffer circuit 170B which are arranged in such an order from the data terminal 31B to the axis of symmetry C.

The directions of the cells other than the input first-stage circuits 110 (the delay circuits 150, latch circuits 160, and buffer circuits 170) will now be described. The directions of the cells belonging to the group A are 180° different from those of the cells belonging to the group B. More specifically, the plurality of transistors included in the cells are laid out with the same shapes and sizes but in 180° different directions. In other words, such cells of the groups A and B are symmetrically arranged in a transistor level.

On the other hand, as shown in FIG. 20, the transistors included in the input first-stage circuits 110A and 110B are the same not only in shape and size but also in direction. In other words, the input first-stage circuits 110A and 110B the groups A and B are in a shift arrangement in a transistor level.

With the foregoing layout, the signals of the groups A and B flow in 180° different directions. This makes the propagation distances of the signals in the groups A and B the same. The directions of the currents flowing in the input first-stage circuits 110 of the groups A and B are also the same, which prevents even a slight difference in characteristic due to a difference in the direction of currents. As a result, the present embodiment provides a layout that is suitable when differences in characteristic due to a difference in the direction of currents need to be cancelled out even in the waveform generation circuits 130 and the voltage conversion circuits 140. Note that the input lines 121 and 122 become somewhat longer than in the second embodiment.

Next, a fourth preferred embodiment of the present invention will be described.

Figure 21:
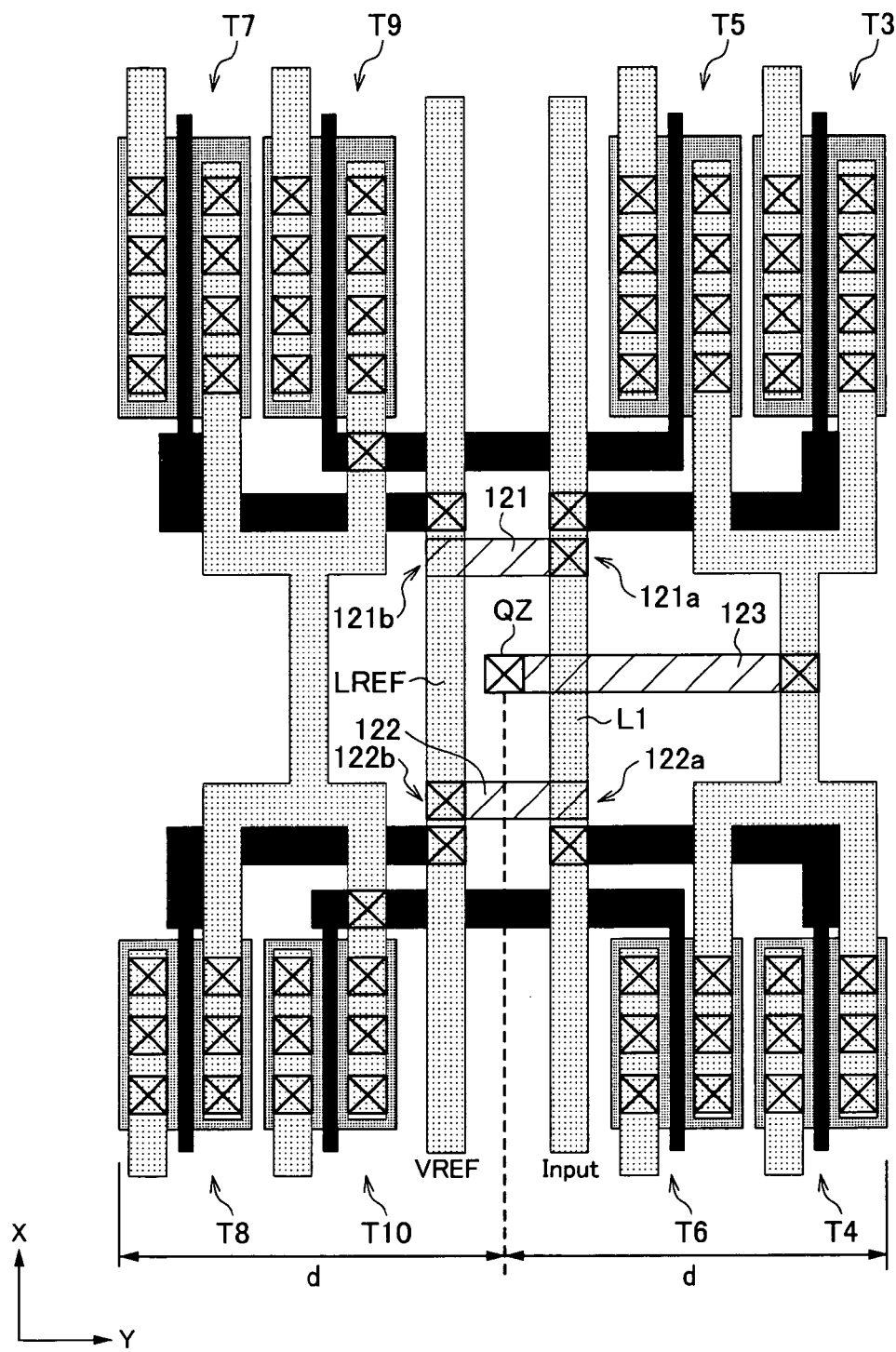
FIG. 21 is a general plan view showing the layout of the transistors T3 to T10 which constitute an amplifier circuit 120 according to a fourth embodiment of the present invention.

Turning to FIG. 21, there is a general plan view showing the layout of the transistors T3 to T10 which constitute an amplifier circuit 120. The layout corresponds to the fourth embodiment of the present invention.

As shown in FIG. 21, the present embodiment differs from the first embodiment shown in FIG. 8 in that; the input line L1 and the reference fine LREF extending in the X direction are not arranged at the ends of the amplifier circuit 120 in the Y direction but are arranged generally in the center in the Y direction. The input lines 121 and 122 extending in the Y direction are reduced in length accordingly. Specifically, the length of the input lines 121 and 122 in the Y direction is the same as the distance between the input line L1 and the reference line LREF in the Y direction. Like the first to third embodiments, write data DQ can be input from either of the ends 121a and 121b of the input line 121. The reference potential VREF can be supplied from either of the ends 122a and 122b of the input line 122. The wiring loads remain unchanged regardless of which ends the write data DQ and the reference potential VREF are supplied from. The reduced length of the input lines 121 and 122 makes the wiring resistances smaller.

The output terminal QZ of the amplifier circuit 120 is arranged in the center of the cell constituted by the transistors T3 to T10 in the Y direction through the output line 123. That is, the distances from respective ends of the cell in the Y direction to the output terminal QZ in the Y direction ore both d. Since the output terminal QZ is arranged in the center in the Y direction, the wiring load remains the same regardless of whether the output signal OUT of the amplifier circuit 120 is output to the right side of FIG. 21 (the side of the input line L1) or to the left side of FIG. 21 (the side of the reference line LREF) through the second wiring layer M2.

Figure 22:
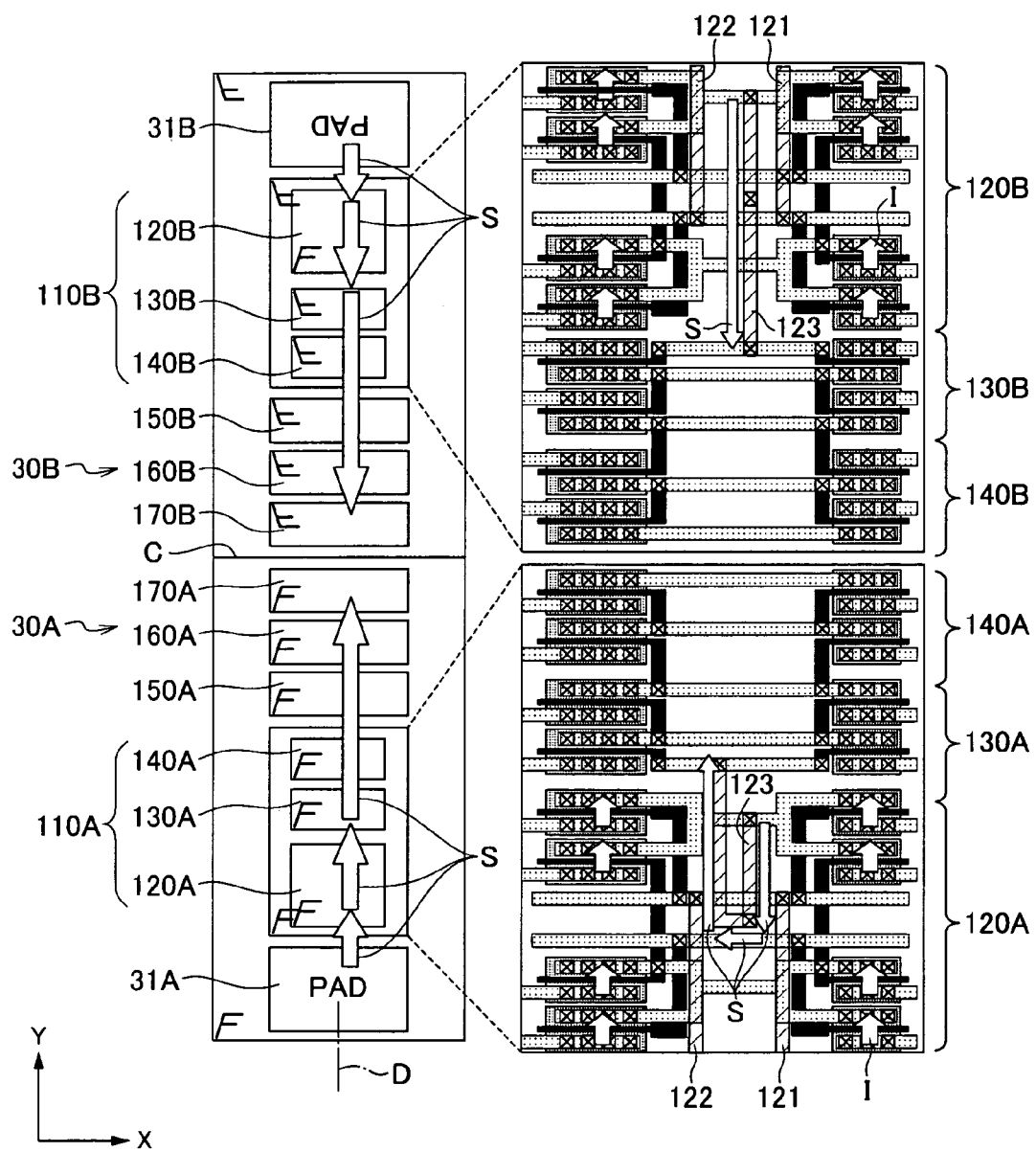
FIG. 22 is a plan view for explaining the layout of two data input/output circuits 30 and data terminals 31 adjoining in the Y direction according to the fourth embodiment.

Turning to FIG. 22, there is a plan view for explaining the layout of two data input/output circuits 30 and data terminals 31 adjoining in the Y direction according to the fourth embodiment.

The layout shown in FIG. 22 is basically the same as that shown in FIG. 9. In both the groups A and B, an amplifier circuit 120, a waveform generation circuit 130, a voltage conversion circuit 140, a delay circuit 150, a latch circuit 160, and a buffer circuit 170 are arranged in such an order from a data terminal 31 to the axis of symmetry C. As for the directions of the cells other than the amplifier circuits 120 (the waveform generation circuits 130, voltage conversion circuits 140, delay circuits 150, latch circuits 160, and buffer circuits 170), the cells belonging to the group A and those belonging to the group B are in 180° different directions. On the other hand, the transistors included in the amplifier circuits 120A and 120B are the same not only in shape and size but also in direction. In other words, the amplifier circuits 120 of the groups A and B are in a shift arrangement in a transistor level.

The foregoing layout can provide the same effects as those of the first embodiment. In addition, the shorter input lines 121 and 122 can reduce the wiring loads.

Next, a fifth preferred embodiment of the present invention will be described. The fifth embodiment deals with an application of the present invention to an address input circuit 23.

Figure 23:
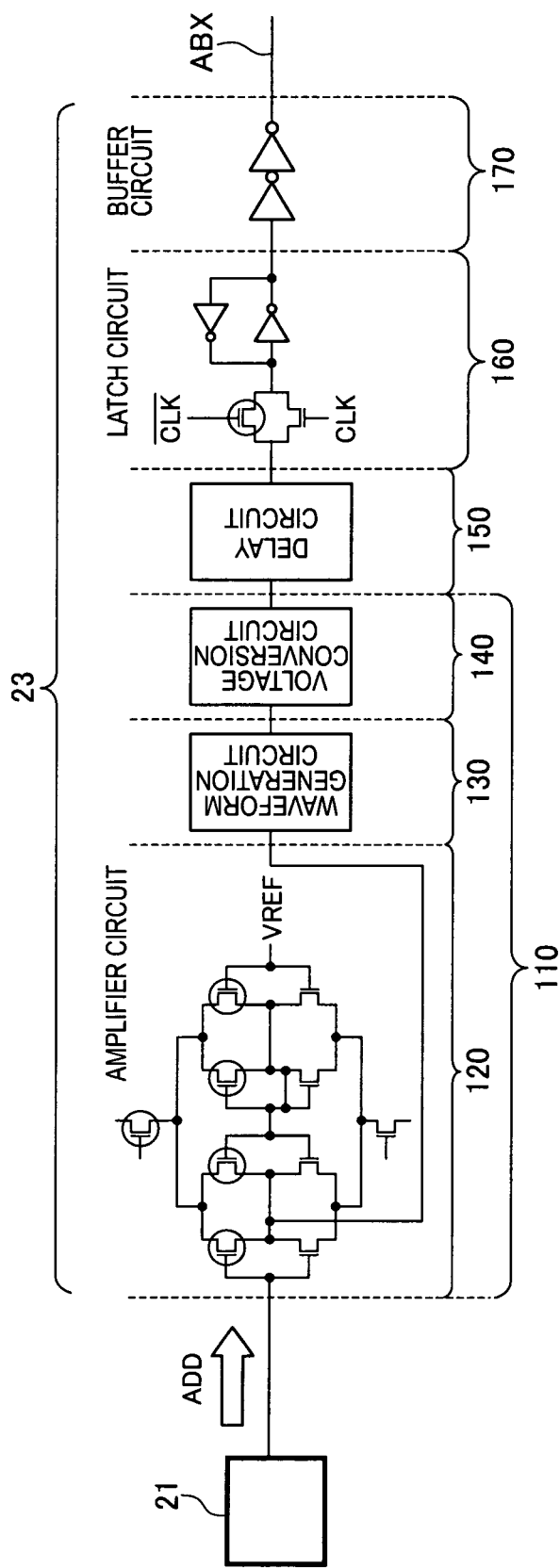
FIG. 23 is a circuit diagram of the address input circuit 23 shown in FIG. 2.

Turning to FIG. 23, the address input circuit 23 has the same circuit configuration as that of the data input circuit 100 shown in FIG. 4. Specifically, the address input circuit 23 includes an input first-stage circuit 110, and a delay circuit 150, a latch circuit 160, and a buffer circuit 170 which are connected subsequent to the input first-stage circuit 110. The input first-stage circuit 110 includes an amplifier circuit 120, a waveform generation circuit 130, and a voltage conversion circuit 140. With such a configuration, an address signal ADD input to the address input circuit 23 is supplied to the address bus ABX through the address input circuit 23.

Figure 24:
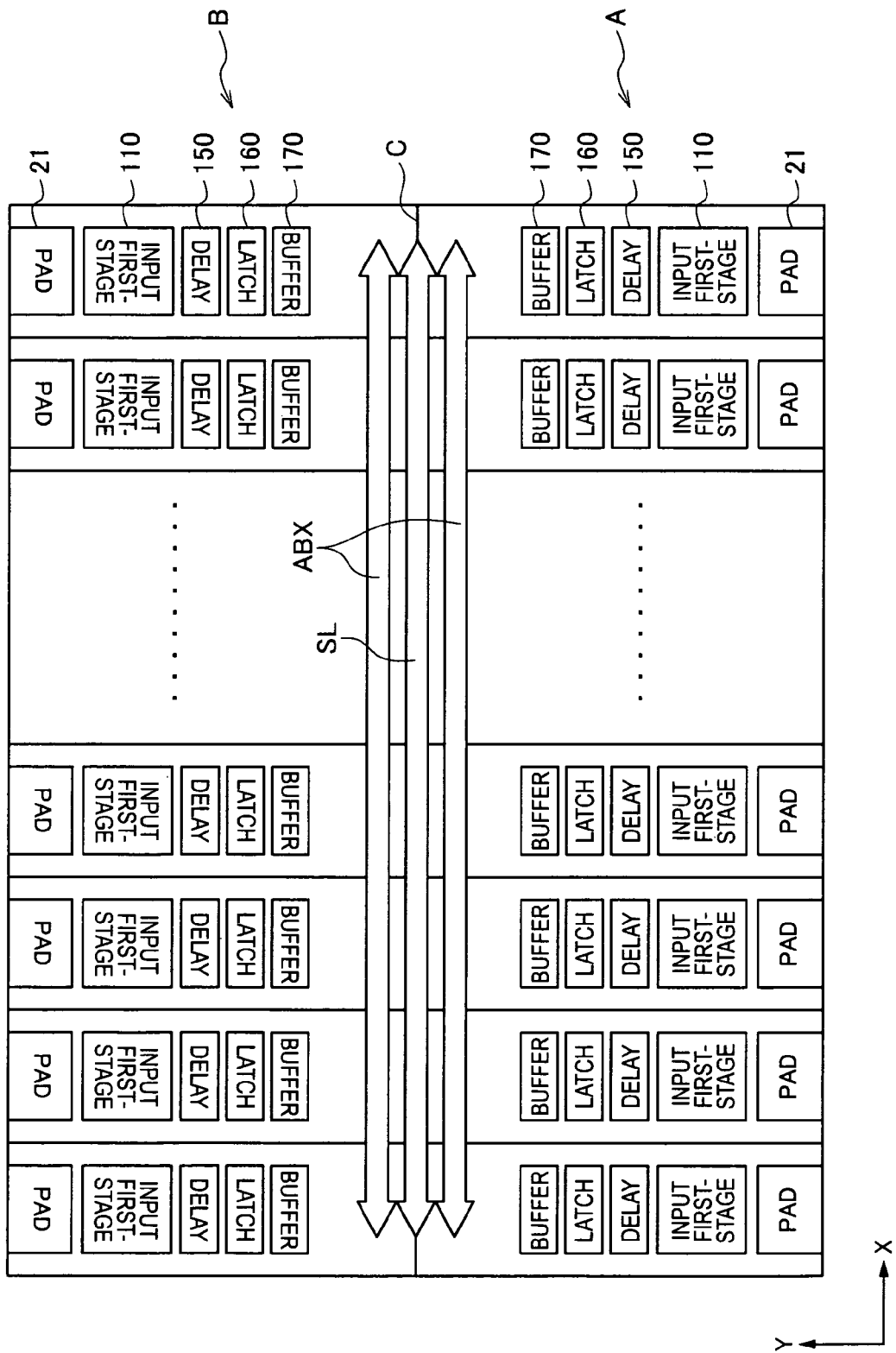
FIG. 24 is a schematic plan view for explaining the layout of address terminals 21 and address input circuits 23 according to a fifth embodiment of the present invention.

Turning to FIG. 24, address terminals 21 are arranged in two rows as separate groups A and B. Address input circuits 23 are arranged between the two rows of address terminals 21. The group A and the group B are arranged symmetrically about an axis of symmetry C which extends in the X direction. In the group A, the flow of signals from the address terminals 21 to an address bus ABX is upward in the diagram. In the group B, the flow of signals from the address terminals 21 to an address bus ABX is downward in the diagram. Signal lines SL are arranged between the address buses ABX so as to extend in the X direction. Clock signals are supplied to the signal lines SL.

Figure 25:
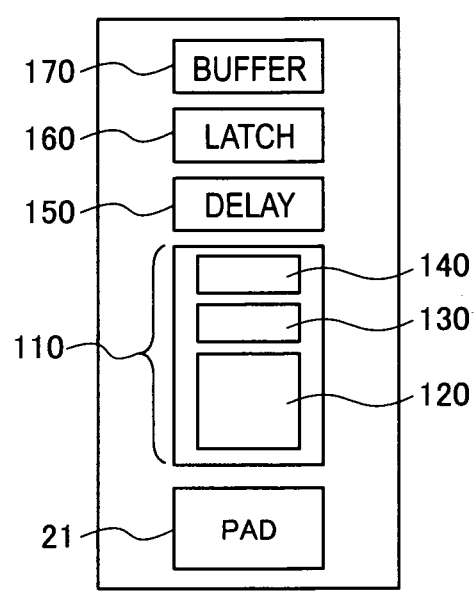
FIG. 25 is a block diagram showing an example of arrangement of cells that constitute an address input circuit 23 according to the fifth embodiment of the present invention.

Turning to FIG. 25, the internal arrangement of the input first-stage circuit 110 is common to the groups A and B shown in FIG. 24. Specifically, an amplifier circuit 120, a waveform generation circuit 130, and a voltage conversion circuit 140 are laid out in such order in the direction from an address terminal 21 to the axis of symmetry C. The layout is the same as in the foregoing first and fourth embodiments. The cells of the groups A and B are symmetrically arranged, and only the plurality of transistors constituting the amplifier circuits 120 are put in a shift arrangement. Alternatively, like the foregoing second and third embodiments, two or more cells included in the input first-stage circuit 110 may be regarded as a single circuit block. Such circuit blocks of the groups A and B may be put in a shift arrangement in a transistor level.

As described above, the range of application of the present invention is not limited to the data input/output circuits 30 and may be applied to the address input circuits 23 as well. While the present embodiment has dealt with the case where the present invention is applied to the address input circuits 23, the present invention may be applied to command input circuits 24. The present invention may also be applied to input circuits of signals other than address signals ADD and command signals CMD (such as clock signals).

Next, a sixth preferred embodiment of the present invention will be described. The sixth embodiment deals with an example where data terminals 31 are arranged in two rows at respective ends of a chip.

Figure 26:
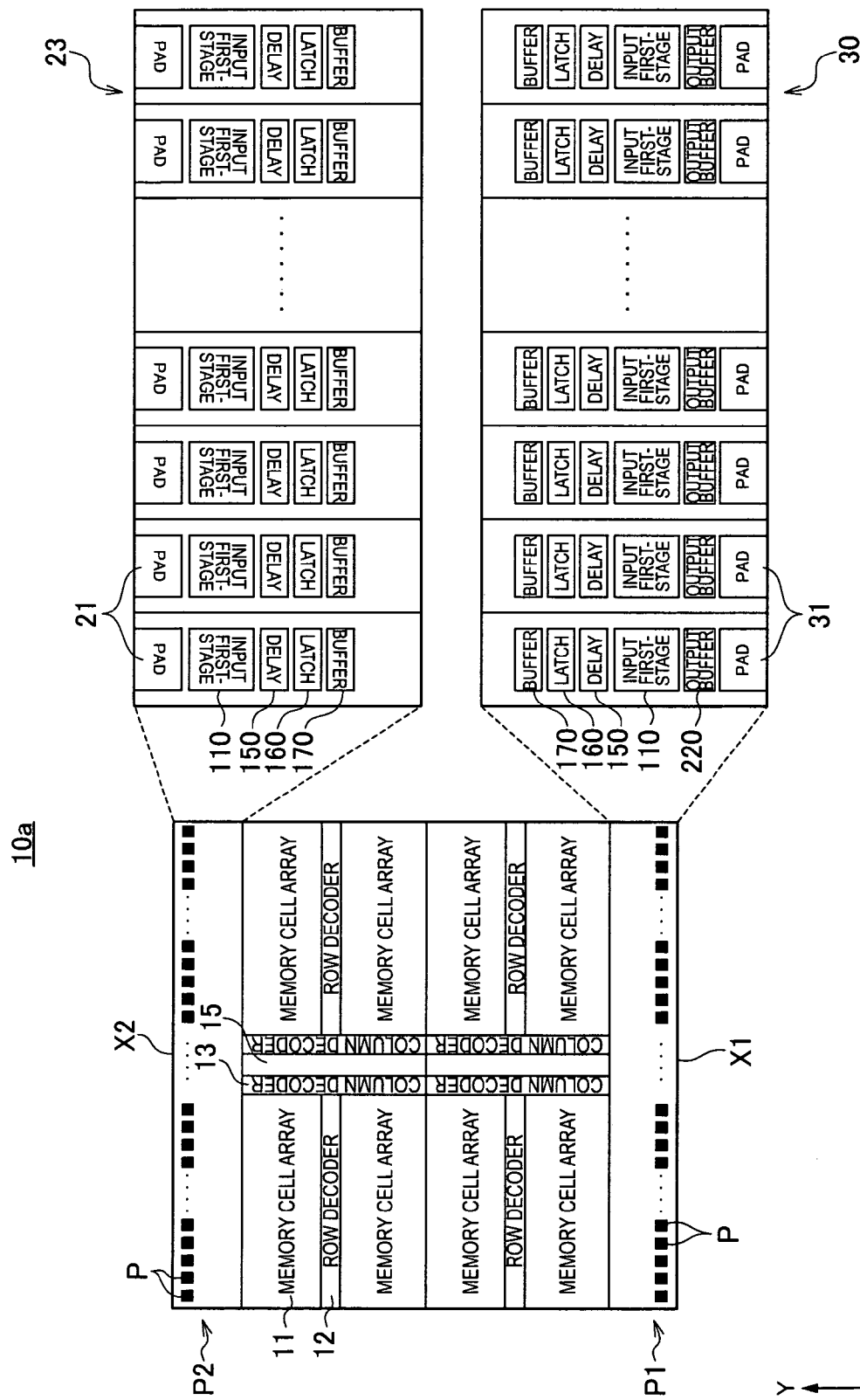
FIG. 26 is a partly enlarged schematic plan view showing the layout of a semiconductor device 10a according to a sixth embodiment of the present invention.

Turning to FIG. 26, in the present embodiment, a plurality of terminals P are arranged along chip sides x1 and x2 that extend in the X direction. Examples of the terminals P include address terminals 21, command terminals 22, and data 11, row decoders 12, and column decoders 13 are laid out between a row of terminals P1 that are arranged along the chip side x1 and a row of terminals P2 that are arranged along the chip side x2.

In the present example, the row of terminals P1 mostly includes data terminals 31. The row of terminals P2 mostly includes address terminals 21. Consequently, write data DQ flows upward in the diagram through the data terminals 31. An address signal ADD flows downward in the diagram through the address terminals 21. As described above, according to the present invention, signals flowing in 180° different directions need not necessarily be of the same type and may be of different types like write data DQ and an address signal ADD.

Next, a seventh preferred embodiment of the present invention will be described. The seventh embodiment deals with an example where the input first-stage circuits include no differential amplifier.

Figure 27:
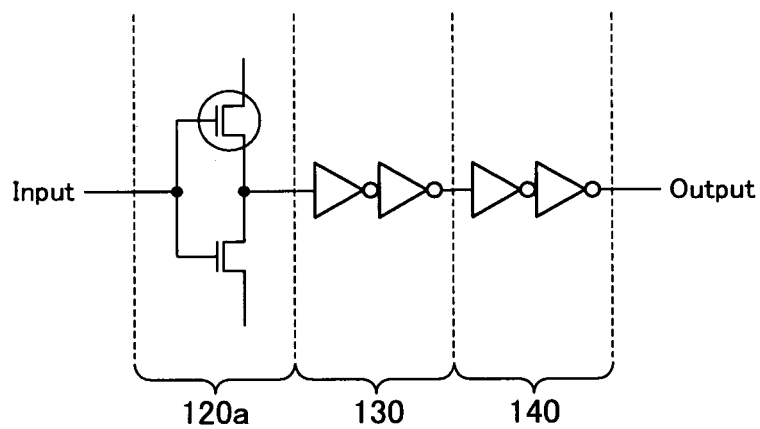
FIG. 27 is a circuit diagram of an input first-stage circuit 110a according to a seventh embodiment of the present invention.

Turning to FIG. 27, the input first-stage circuit 110a according to the present embodiment includes an inverter 120a, a waveform generation circuit 130, and a voltage conversion circuit 140 which are connected in series. The waveform generation circuit 130 and the voltage conversion circuit 140 each include two stages of inverters. With such a configuration, the input first-stage circuit 110a according to the present embodiment includes no differential amplifier.

Figure 28:
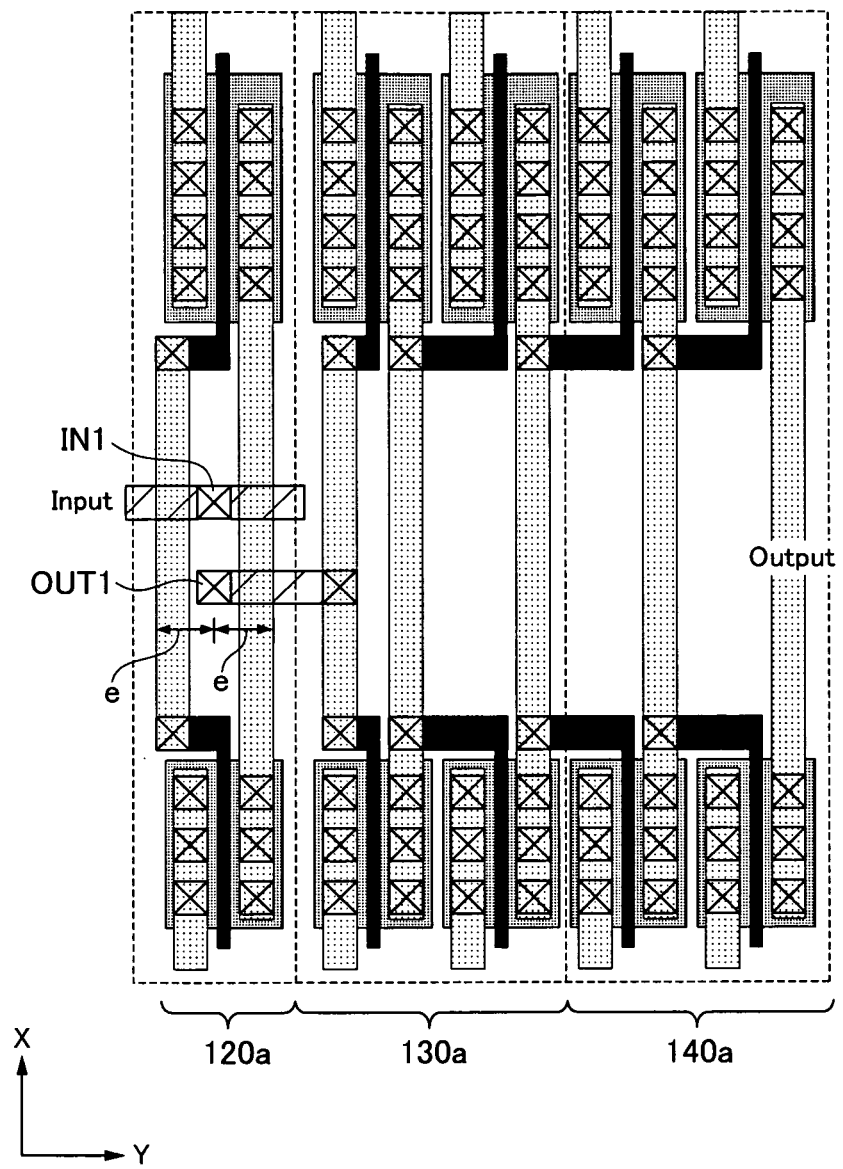
FIG. 28 is a general plan view showing the layout of transistors that constitute the input first-stage circuit 110a shown in FIG. 27.

Turning to FIG. 28, both an input terminal IN1 and an output terminal OUT1 of the inverter 120a are arranged in the center of the inverter 120a in the Y direction. The input terminal IN1 and the output terminal OUT1 have the same Y coordinate. The distances from the Y coordinate to respective ends of the inverter 120a in the Y direction are both e. Consequently, wiring loads remain unchanged regardless of which sides in the Y direction an input line connected to the input terminal IN1 and an output line connected to the output terminal OUT1 are arranged on. Since the wiring loads will not change even in a layout where the inverter 120a is rotated by 180°, the same effects as those of the foregoing embodiments can be obtained.

Figure 29:
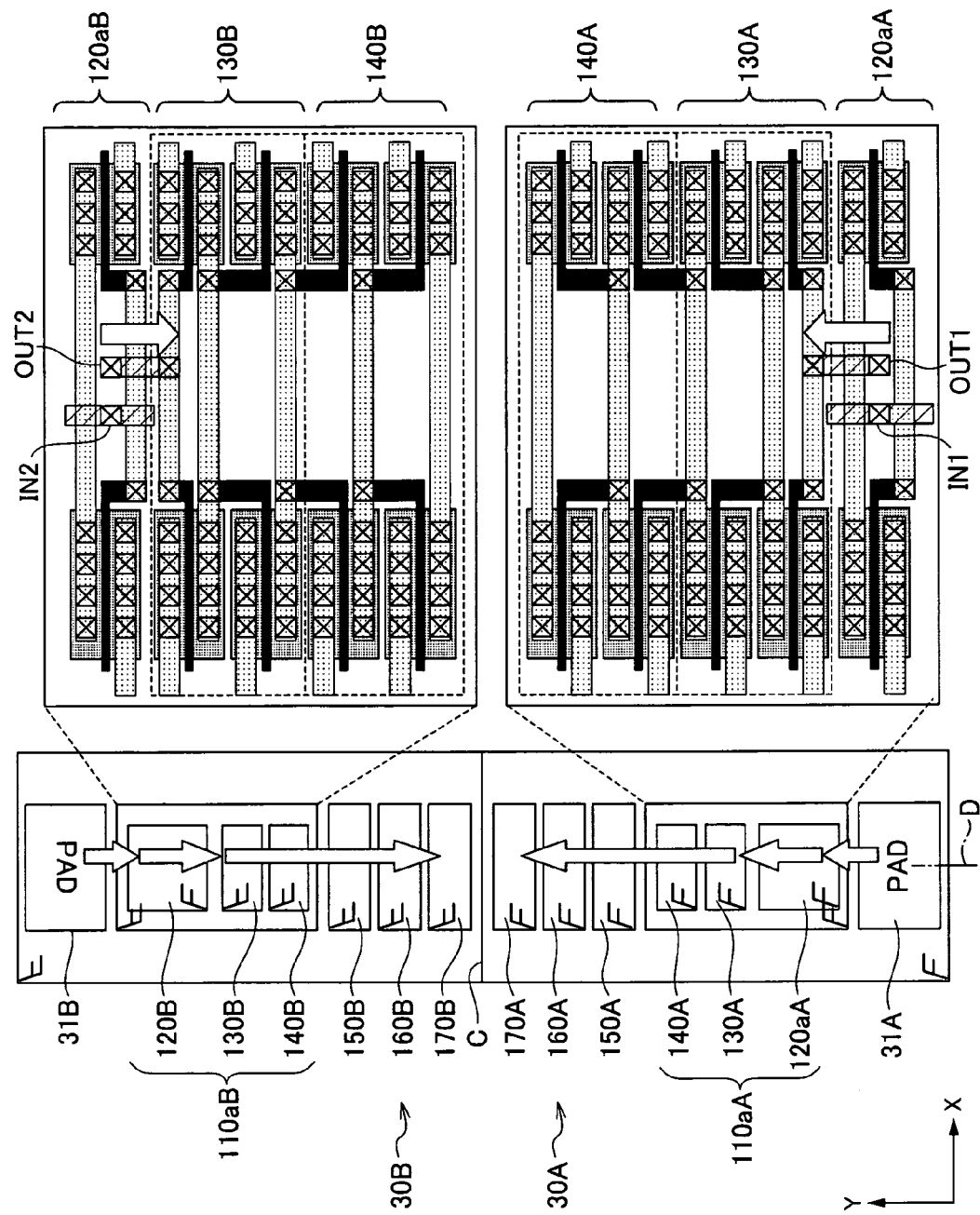
FIG. 29 is a plan view for explaining the layout of two data input/output circuits 30 and data terminals 31 adjoining in the Y direction according to the seventh embodiment of the present invention.

Turning to FIG. 29, there is a plan view for explaining the layout of two data input/output circuits 30 and data terminals 31 adjoining in the Y direction according to the seventh embodiment.

The layout shown in FIG. 29 is basically the same as that shown in FIG. 9. In both the groups A and B, an inverter 120a, a waveform generation circuit 130, a voltage conversion circuit 140, a delay circuit 150, a latch circuit 160, and a buffer circuit 170 are arranged in such an order from a data terminal 31 to the axis of symmetry C. As for the directions or the cells other than the inverters 120a (the waveform generation circuits 130, voltage conversion circuits 140, delay circuits 150, latch circuits 160, and buffer circuits 170), the cells belonging to the group A and those belonging to the group B are in 180° directions. On the other hand, the transistors included in the inverters 120aA and 120aB are the same not only in shape and size but also in direction. In other words, the inverters 120a of the groups A and B are in a shift arrangement in a transistor level. Such a layout can provide the same effects as those of the first embodiment.

Next, an eighth preferred embodiment of the present invention will be described. The eighth embodiment deals with an example where the present invention is applied to circuits different from input first-stage circuits.

Figure 30:
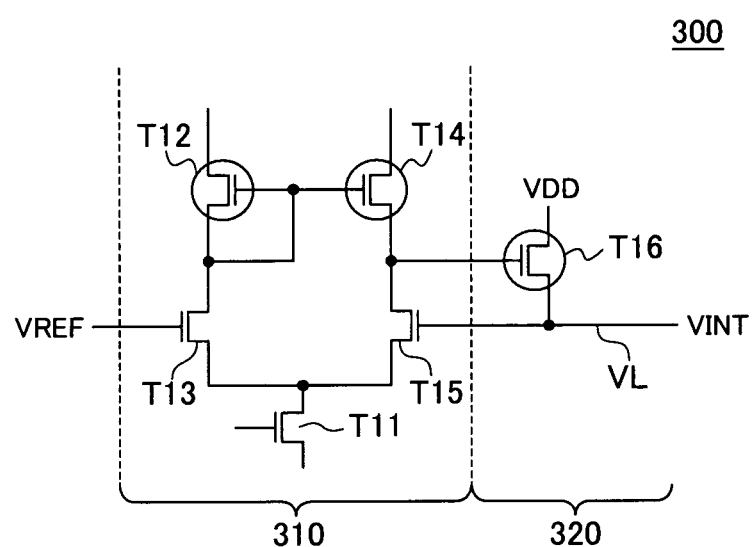
FIG. 30 is a circuit diagram of an internal power supply generation circuit 300 according to an eighth embodiment of the present invention.

Turning to FIG. 30, the internal power supply generation circuit 300 includes an amplifier circuit 310 and a driver circuit 320. The amplifier circuit 310 has a current mirror amplifier structure and includes transistors T11 to T15. The transistor T11 is an N-channel MOS transistor. The transistor T11 serves as a switch for supplying an operating current to the amplifier circuit 310. The transistors T12 and T14 are P-channel MOS transistors. The transistors T12 and T14 constitute a current mirror circuit. The transistors T13 and T15 are N-channel MOS transistors. A reference voltage VREF and an internal potential VINT are supplied co the gate electrodes of the transistors T13 and T15, respectively.

The driver circuit 320 includes a P-channel MOS transistor T16 which is connected between a power supply potential VDD and an internal power supply line VL. The gate electrode of the driver circuit 320 is connected to the connection node between the transistors T14 and T15. With such a configuration, the driver circuit 320 is controlled so that the internal potential VINT coincides with the potential of the reference voltage VREF.

Figure 31:
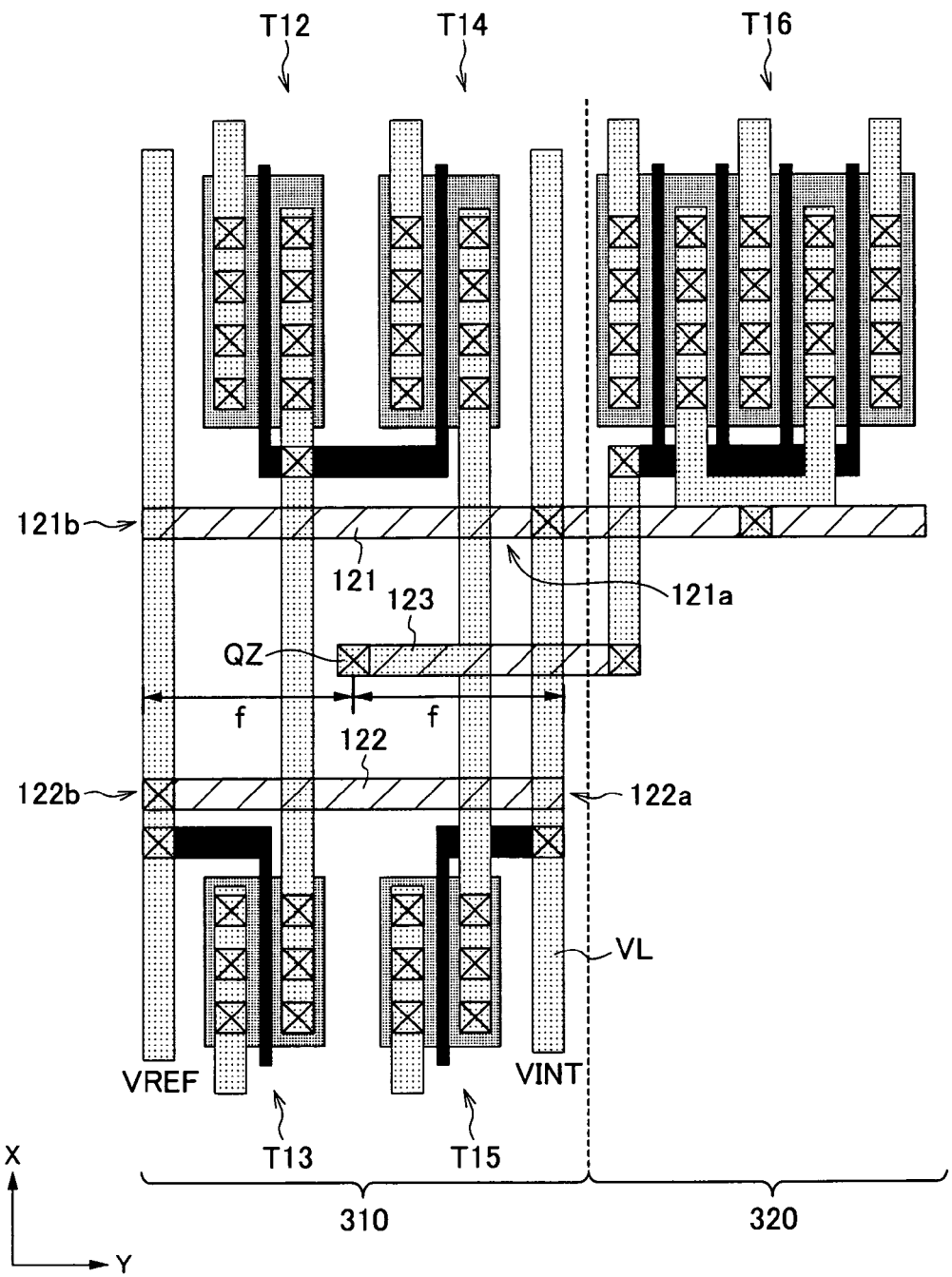
FIG. 31 is a general plan view showing the layout of the transistors T12 to T16 which constitute the internal power supply generation circuit 300.

Turning to FIG. 31, there is a general plan view showing the layout of the transistors T12 to T16 which constitute the internal power supply generation circuit 300. Note that the transistor T11 included in the power supply generation circuit 300 is omitted in FIG. 31. The circuit block constituted by the transistors T11 to T15 is a sensitive circuit.

As shown in FIG. 31, an internal power supply line VL extends in the X direction at one end (right) of the amplifier circuit 310 in the Y direction. A reference line LREF extends in the X direction at the other end (left) of the amplifier circuit 310 in the Y direction. The amplifier circuit 310 has a length of 2f in the Y direction, which coincides with the distance between the internal power supply line VL and the reference line LREF. Like the first embodiment, input lines 121 and 122 both extend in the Y direction and have a length of 2f. The internal potential VINT can thus be supplied to the input line 121 both from one end 121a and from the other end 121b. Similarly, a reference potential VREF can be supplied to the input line 122 both from one end 122a and from the other end 122b. The wiring loads remain unchanged regardless of which ends the internal potential VINT and the reference potential VREF are supplied from.

An output terminal QZ of the amplifier circuit 310 is arranged in the center of the cell in the Y direction. More specifically, the distance from the internal power supply line VL to the output terminal QZ in the Y direction is f. The distance from the reference line LREF to the output terminal QZ in the Y direction is also f. The output terminal QZ is led out to the second wiring layer M2 through a contact conductor, and connected to the driver circuit 320 through an output line 123. Since the output terminal QZ is arranged in the center in the Y direction, the wiring load remains the same even when the amplifier circuit 310 and the driver circuit 320 are in reverse positions.

Figure 32:
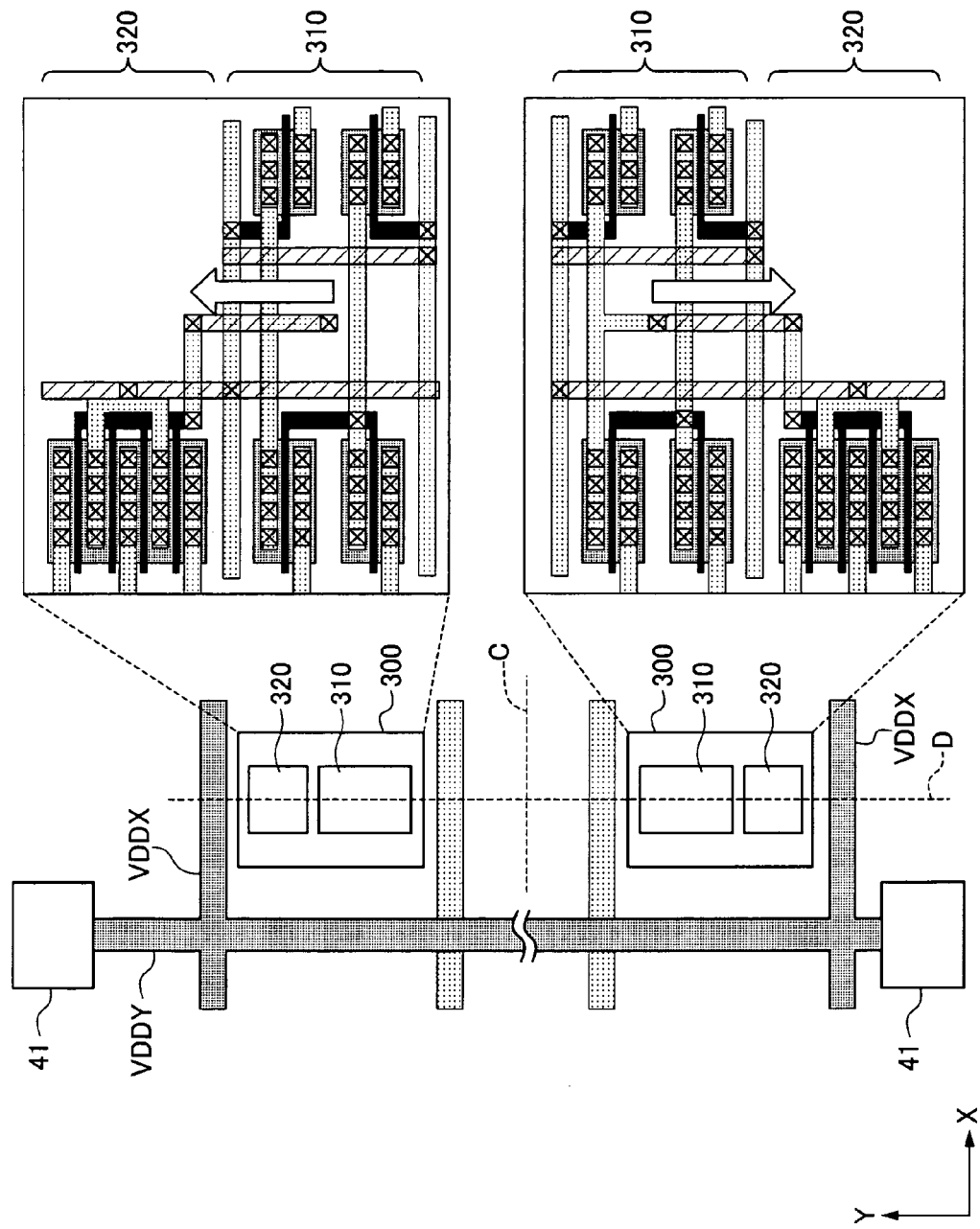
FIG. 32 is a plan view for explaining the layout of two internal power supply generation circuit 300 adjoining in the Y direction according to the eighth embodiment of the present invention.

The amplifier circuit 310 and the driver circuit 320 may be put in reverse positions because of layout problems. Specifically, the source side of the transistor T16 constituting the driver circuit 320 needs to have a low resistance and thus needs to be located near a power supply main line to which the power supply potential VDD is supplied. For example, as shown in FIG. 32, suppose there are provided a power supply main line VDDY and power supply main lines VDDX. The power supply main line VDDY extends in the Y direction and is connected to power supply terminals 41. The power supply main lines VDDX branch off from the power supply main line VDDY and extend in the X direction. Two internal power supply generation circuits 300 are laid out so that their driver circuits 320 are located near the power supply main lines VDDX. In such a case, the two internal power supply generation circuits 300 are arranged on an axis D so as to be symmetrical about an axis of symmetry C.

As shown in FIG. 32, if the cells are symmetrically arranged and the plurality of transistors constituting the amplifier circuits 310 are put in a shift arrangement, the directions of the currents flowing in the amplifier circuits 310 coincide and there occurs no difference in characteristic due to a difference in the direction of currents.

As described above, the present invention may be applied to circuits different from input first-stage circuits. While the eighth embodiment has dealt with the case where the present invention is applied to internal power supply generation circuits 300, the present invention may be applied to other circuits.

It is apparent that the present invention is not limited to the above embodiments, but may be modified and changed without departing from the scope and spirit of the invention.

The technical concept of the present invention is also applicable to semiconductor devices having various functional cells other than data circuits, address circuits, command circuits, and internal power supply generation circuits. The forms of the circuits in the circuit blocks disclosed in the drawings and other circuits for generating the control signals are not limited to the circuit terms disclosed in the embodiments.

The technical idea of the present application can be applied to various semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
    first and second input ports;
    first and second output nodes;
    a first transistor including first and second diffusion regions defining a first channel region therebetween and a first gate electrode formed over the first channel region, the first diffusion region being electrically connected to the first output node, the second diffusion region being disposed between the first diffusion region and the first input port and supplied with a first operating potential, and the first gate electrode being electrically connected to the first input port; and
    a second transistor including third and fourth diffusion regions defining a second channel region therebetween and a second gate electrode formed over the second channel region, the third diffusion region being supplied with the first operating potential, the fourth diffusion region being disposed between the third diffusion region and the second input port and electrically connected to the second output node, and the second gate electrode being electrically connected to the second input port.

2. The device as claimed in claim 1, wherein the first output node is disposed between the first input port and the second output node, and the second output node is disposed between the second input port and the first output node.

3. The device as claimed in claim 2, wherein the first transistor is disposed between the first and second output nodes, and the second transistor is disposed between the second output node and the second input port.

4. The device as claimed in claim 1, wherein each of the first and second input ports serves as a bonding pad to receive a signal from an outside of the device.

5. The device as claimed in claim 1, where in the first and second input ports and the first and second transistors are arranged in a first direction.

6. The device as claimed in claim 5, wherein the device further comprises:
    a first interconnection line elongating in a second direction between the first and third diffusion regions and electrically connected to the first input port, the second direction being substantially perpendicular to the first direction;
    a second interconnection line elongating in the first direction to electrically connect the first interconnection line and the first gate electrode with each other;
    a third interconnection line elongating in the second direction between the second input port and the fourth diffusion region and electrically connected to the second input port; and
    a fourth interconnection line elongating in the first direction to electrically connect the third interconnection line and the second gate electrode with each other.

7. The device as claimed in claim 6, wherein the device further comprises:
    a fifth interconnection line provided to electrically connect the first output node and the first diffusion region with each other, the fifth interconnection line crossing the second interconnection line with an isolation therebetween; and
    a sixth interconnection line provided to electrically connect the second output node and the fourth diffusion region with each other, the sixth interconnection line crossing the fourth interconnection line with an isolation therebetween.

8. The device as claimed in claim 7, wherein each of the first and second input ports serves as a bonding pad to receive a signal from an outside of the device.

9. A semiconductor device comprising:
    first and second input ports;
    first and second output nodes;
    a first transistor including first and second diffusion regions defining a first channel region therebetween and a first gate electrode formed over the first channel region, the first diffusion region being electrically connected to the first output node, the second diffusion region being disposed between the first diffusion region and the first input port and supplied with a first operating potential, and the first gate electrode being supplied with a first reference potential;
    a second transistor including third and fourth diffusion regions defining a second channel region therebetween and a second gate electrode formed over the second channel region, the third diffusion region being electrically connected to the first output node, the fourth diffusion region being disposed between the first and third diffusion regions and supplied with the first operating potential, and the first gate electrode being electrically connected to the first input port;
    a third transistor including fifth and sixth diffusion regions defining a third channel region therebetween and a third gate electrode formed over the third channel region, the fifth diffusion region being supplied with the first operating potential, the sixth diffusion region being disposed between the second input port and the fifth diffusion region and electrically connected to the second output node, and the third gate electrode being electrically connected to the second input port; and
    a fourth transistor including seventh and eighth diffusion regions defining a fourth channel region therebetween and a fourth gate electrode formed over the fourth channel region, the seventh diffusion region being supplied with the first operating potential, the eighth diffusion region being disposed between the fifth and seventh diffusion regions and electrically connected to the second output node, and the fourth gate electrode being supplied with the first reference potential.

10. The device as claimed in claim 9, wherein each of the first and second input ports serves as a bonding pad to receive a signal from an outside of the device.

11. The device as claimed in claim 9, wherein the first, second, third and fourth transistors are arranged substantially in line between the first and second input ports.

12. The device as claimed in claim 11,
wherein the first and second transistors are arranged adjacently to each other and the third and fourth transistors are arranged adjacently to each other; and
wherein the device further comprises a plurality of additional transistors that are disposed between the second and fourth transistors.

13. The device as claimed in claim 12, wherein the additional transistors are arranged substantially in line between the second and fourth transistors.

14. The device as claimed in claim 9, wherein the first, second, third and fourth transistors are equal in channel type as one another.

* * * * *